US012575135B2

(12) United States Patent
Kim et al.

(10) Patent No.: US 12,575,135 B2
(45) Date of Patent: Mar. 10, 2026

(54) SEMICONDUCTOR DEVICES INCLUDING GATE-ALL-AROUND TYPE FIELD EFFECT TRANSISTOR

(71) Applicant: SAMSUNG ELECTRONICS CO., LTD., Suwon-si (KR)

(72) Inventors: Younggwon Kim, Suwon-si (KR); Myunggil Kang, Suwon-si (KR); Dongwon Kim, Suwon-si (KR); Beomjin Park, Suwon-si (KR); Inu Jeon, Suwon-si (KR); Soojin Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 385 days.

(21) Appl. No.: 18/195,749

(22) Filed: May 10, 2023

(65) Prior Publication Data

US 2024/0072149 A1     Feb. 29, 2024

(30) Foreign Application Priority Data

Aug. 29, 2022     (KR) ........................ 10-2022-0108595

(51) Int. Cl.
H10D 30/67 (2025.01)
H10D 30/43 (2025.01)
(Continued)

(52) U.S. Cl.
CPC ......... H10D 30/6735 (2025.01); H10D 30/43 (2025.01); H10D 30/6757 (2025.01);
(Continued)

(58) Field of Classification Search
CPC ........... H10D 30/6735; H10D 30/6757; H10D 30/62; H10D 62/124
See application file for complete search history.

(56) References Cited

U.S. PATENT DOCUMENTS 10,204,902 B2     2/2019  Lee
10,229,971 B1 *   3/2019  Cheng ................ H10D 84/0144
(Continued)

FOREIGN PATENT DOCUMENTS

DE      10 2018 108 598 A1     2/2019
KR      10-2017-0109487 A      9/2017
(Continued)

OTHER PUBLICATIONS

Communication issued on Feb. 5, 2024 by the European Patent Office for European Patent Application No. 23187210.2.
(Continued)

*Primary Examiner* — Nduka E Ojeh
(74) *Attorney, Agent, or Firm* — Sughrue Mion, PLLC

(57) ABSTRACT

A semiconductor device includes a substrate including an active region extending in a first direction, a gate electrode layer crossing the active region and extending in a second direction, a plurality of channel layers on the active region, spaced apart from each other in a third direction, perpendicular to an upper surface of the substrate, and disposed sequentially from the active region, and surrounded by the gate electrode layer, gate spacer layers disposed on side surfaces of the gate electrode layer in the first direction, and source/drain regions disposed on the active region, on sides of the gate electrode layer, and connected to the plurality of channel layers. An uppermost channel layer among the plurality of channel layers includes channel portions separated from each other in the first direction and disposed below the gate spacer layers.

17 Claims, 24 Drawing Sheets

(51) Int. Cl.
    *H10D 62/10*         (2025.01)
    *H10D 64/01*         (2025.01)
    *H10D 64/23*         (2025.01)

(52) U.S. Cl.
    CPC ......... *H10D 62/121* (2025.01); *H10D 64/017* (2025.01); *H10D 64/258* (2025.01)

(56) References Cited

U.S. PATENT DOCUMENTS

| | | | |
|---|---|---|---|
| 10,522,622 | B2 | 12/2019 | Cheng et al. |
| 11,069,818 | B2 | 7/2021 | Kang et al. |
| 11,094,803 | B1 | 8/2021 | Xie et al. |
| 2014/0151639 | A1 | 6/2014 | Chang et al. |
| 2016/0172358 | A1 | 6/2016 | Hatcher et al. |
| 2017/0271514 | A1 | 9/2017 | Kittl et al. |
| 2018/0083113 | A1* | 3/2018 | Balakrishnan ......... H10D 64/01 |
| 2019/0067122 | A1 | 2/2019 | Cheng et al. |
| 2019/0279911 | A1 | 9/2019 | Cheng et al. |
| 2020/0020689 | A1 | 1/2020 | Ohtou et al. |
| 2020/0043926 | A1 | 2/2020 | Ohtou et al. |
| 2020/0168715 | A1 | 5/2020 | Wu et al. |
| 2020/0395446 | A1* | 12/2020 | Yi ........................... B82Y 10/00 |
| 2021/0202731 | A1* | 7/2021 | Chiang ................ H10D 64/518 |
| 2021/0408022 | A1 | 12/2021 | Young et al. |
| 2021/0408289 | A1 | 12/2021 | Guha et al. |

FOREIGN PATENT DOCUMENTS

| | | | |
|---|---|---|---|
| KR | 10-2020-0007711 | A | 1/2020 |
| KR | 10-2022-0000797 | A | 1/2022 |
| KR | 10-2022-0002032 | A | 1/2022 |
| KR | 10-2374052 | B1 | 3/2022 |

OTHER PUBLICATIONS

Communication dated Nov. 25, 2025, issued by the Korean Intellectual Property Office in Korean Patent Application No. 10-2022-0108595.

* cited by examiner

SEMICONDUCTOR DEVICES INCLUDING GATE-ALL-AROUND TYPE FIELD EFFECT TRANSISTOR

CROSS-REFERENCE TO RELATED APPLICATION(S)

This application claims the benefit of Korean Patent Application No. 10-2022-0108595, filed on Aug. 29, 2022, in the Korean Intellectual Property Office, the disclosure of which is incorporated by reference herein in its entirety.

BACKGROUND

The disclosure relates to a semiconductor device.

As demands for high performance, high speed, and/or multifunctionality semiconductor devices increase, the degree of integration of semiconductor devices is increasing. In manufacturing a semiconductor device with a fine pattern corresponding to the trend for high integration of semiconductor devices, it is necessary to implement patterns having a fine width or a fine separation distance. In addition, to reduce the limitations of operating characteristics due to size reduction of planar metal oxide semiconductor FETs (MOSFETs), efforts are being made to develop semiconductor devices including FinFETs having a three-dimensional channel structure.

SUMMARY

One or more example embodiments provide a semiconductor device having improved electrical characteristics.

According to an aspect of an example embodiment, a semiconductor device includes: a substrate comprising an active region extending in a first direction; a gate electrode layer crossing the active region and extending in a second direction; a plurality of channel layers on the active region, spaced apart from each other in a third direction, perpendicular to an upper surface of the substrate, and disposed sequentially from the active region, and surrounded by the gate electrode layer; gate spacer layers on side surfaces of the gate electrode layer in the first direction; and source/drain regions on the active region, on sides of the gate electrode layer, and connected to the plurality of channel layers, wherein an uppermost channel layer among the plurality of channel layers comprises channel portions separated from each other in the first direction and disposed below the gate spacer layers.

According to an aspect of an example embodiment, a semiconductor device includes: a substrate comprising a first active region extending in a first direction in a first region and a second active region extending in the first direction in a second region; a first gate structure, crossing the first active region, on the first region, and extending in a second direction; a second gate structure crossing the second active region, on the second region, and extending in the second direction; a first channel layer, a second channel layer and a third channel layer on the first active region, spaced apart from each other in a third direction, perpendicular to an upper surface of the substrate, disposed sequentially from the first active region, and surrounded by the first gate structure; and a fourth channel layer, a fifth channel layer and a sixth channel layer on the second active region, spaced apart from each other in the third direction and disposed sequentially from the second active region, and surrounded by the second gate structure, wherein the third channel layer comprises channel portions spaced apart from each other in the first direction below the first gate structure.

According to an aspect of an example embodiment, a semiconductor device includes: a substrate comprising an active region extending in a first direction; a gate structure on the substrate, crossing the active region and extending in a second direction; and a first channel layer, a second channel layer and a third channel layer on the active region, spaced apart from each other in a third direction, perpendicular to an upper surface of the substrate, and disposed sequentially from the active region and surrounded by the gate structure, wherein the third channel layer comprises channel portions respectively disposed below end portions of the gate structure in the first direction.

BRIEF DESCRIPTION OF DRAWINGS

The above and other aspects and features will be more be more apparent from the following detailed description of example embodiments, taken in conjunction with the accompanying drawings, in which.

DETAILED DESCRIPTION

Figure 1:
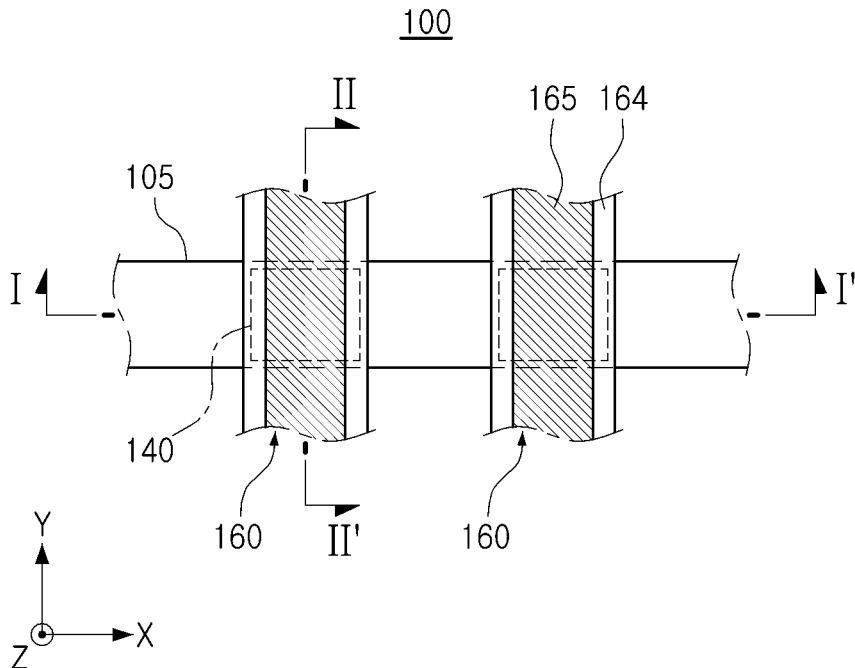
FIG. 1 is a plan view illustrating a semiconductor device according to example embodiments.

Example embodiments will be described more fully with reference to the accompanying drawings, in which example embodiments are shown. Embodiments described herein are provided as examples, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, or all of a, b, and c. It may be understood that terms such as 'on', 'upper portion', 'upper surface', 'below', 'lower portion', 'lower surface', 'side' and the like are indicated are indicated based on the drawings, except where otherwise indicated by reference numerals.

FIG. 1 is a plan view illustrating a semiconductor device according to example embodiments.

Figure 2:
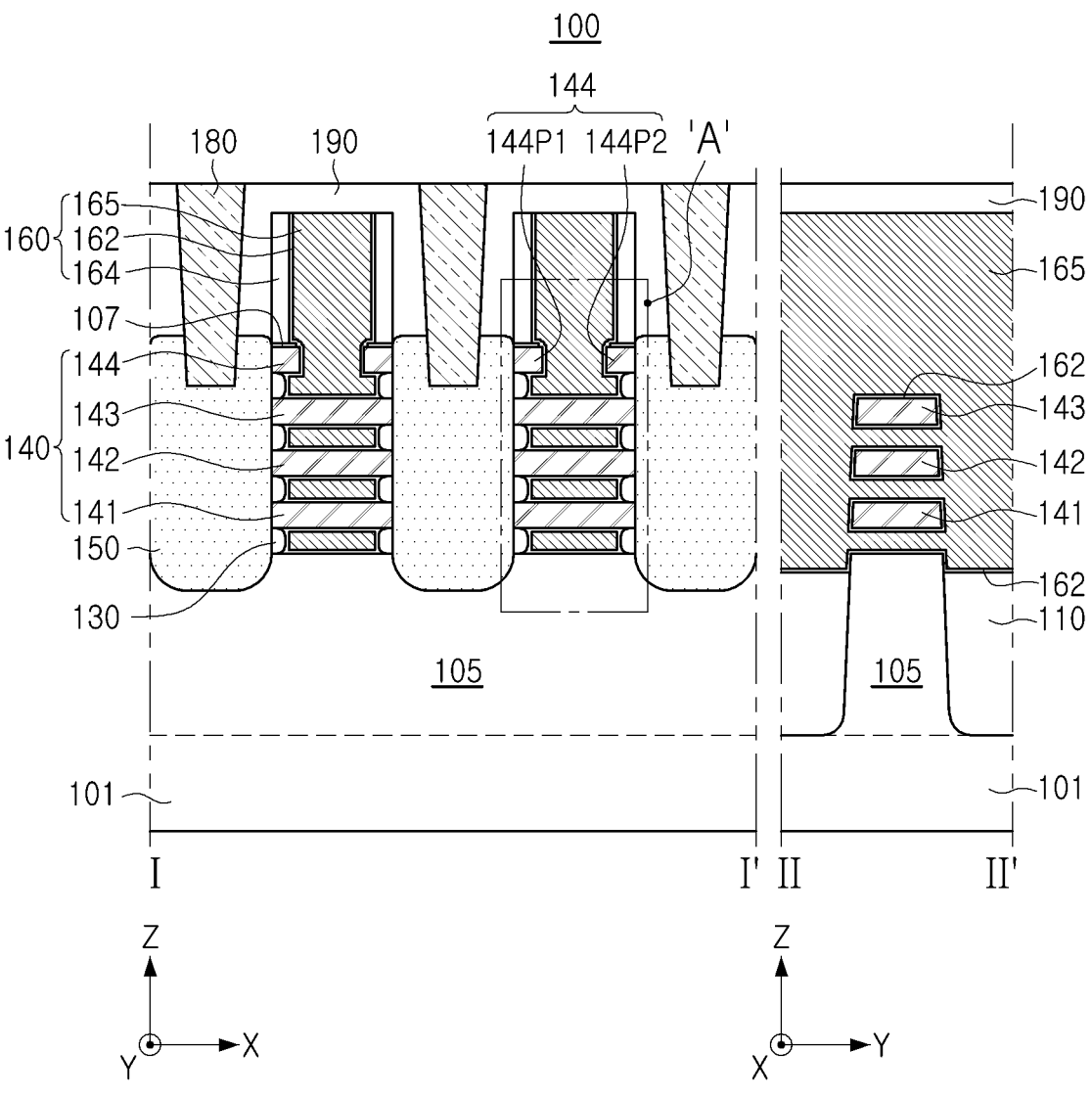
FIG. 2 is a cross-sectional view illustrating a semiconductor device according to example embodiments.

FIG. 2 is a cross-sectional view illustrating a semiconductor device according to example embodiments. FIG. 2 illustrates cross-sections of the semiconductor device of FIG. 1 taken along cutting lines I-I' and II-II'. For convenience of descriptions, only some components of the semiconductor device are illustrated in FIG. 1.

Figure 3:
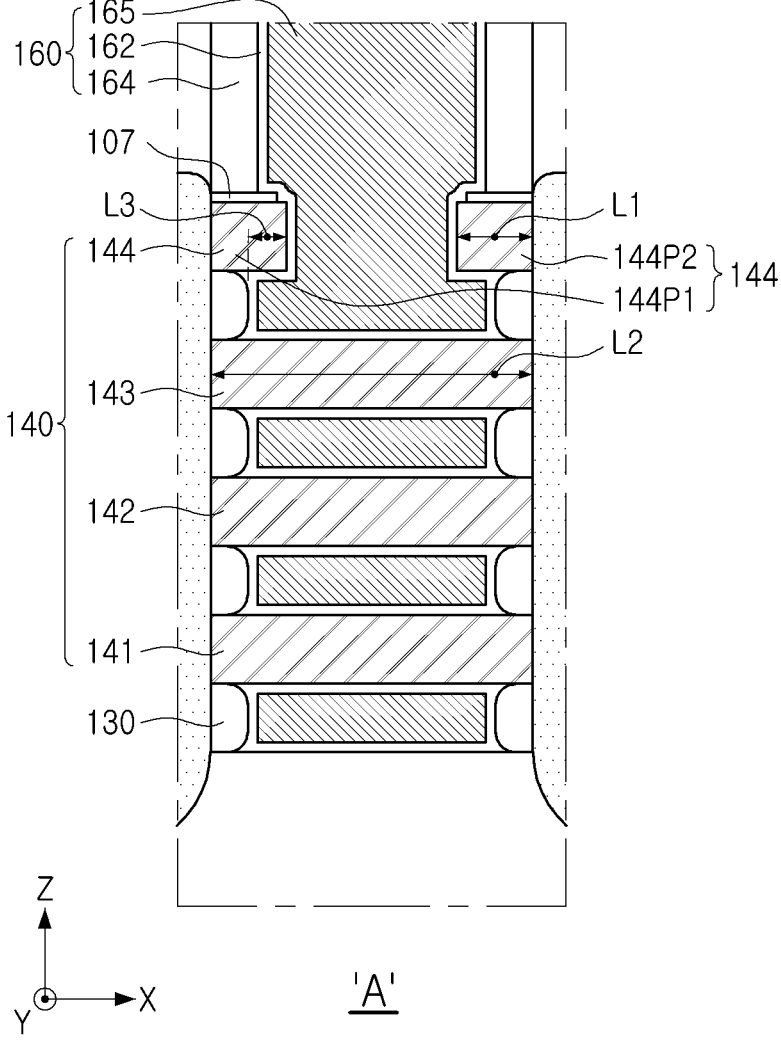
FIG. 3 is a partially enlarged view illustrating a semiconductor device according to example embodiments.

FIG. 3 is a partially enlarged view illustrating a semiconductor device according to example embodiments. FIG. 3 is an enlarged view of area 'A' of FIG. 2.

Referring to FIGS. 1 to 3, a semiconductor device 100 may include a substrate 101 including an active region 105, channel structures 140 including first to fourth channel layers 141, 142, 143, and 144 disposed vertically spaced apart from each other, on the active region 105, gate structures 160 extending to cross the active region 105 and each including a gate electrode layer 165, source/drain regions 150 in contact with the channel structures 140, and contact plugs 180 connected to the source/drain regions 150. The semiconductor device 100 may further include a cover insulating layer 107, a device isolation layer 110, and an interlayer insulating layer 190. Each of the gate structures 160 may further include gate dielectric layers 162 and gate spacer layers 164.

In the semiconductor device 100, the active region 105 has a fin structure, and the gate electrode layer 165 may be disposed between the active region 105 and the channel structure 140, between first to fourth channel layers 141, 142, 143, and 144 of the channel structure 140, and on the channel structure 140. Accordingly, the semiconductor device 100 may include transistors having a Multi-Bridge-Channel FET (MBCFET™) structure, which is a gate-all-around type field effect transistor.

The substrate 101 may have an upper surface extending in the X- and Y-directions. The substrate 101 may include a semiconductor material, such as a Group IV semiconductor, a Group III-V compound semiconductor, or a Group II-VI compound semiconductor. For example, the group IV semiconductor may include silicon, germanium, or silicon-germanium. The substrate 101 may be provided as a bulk wafer, an epitaxial layer, a Silicon On Insulator (SOI) layer, or a Semiconductor On Insulator (SeOI) layer.

The substrate 101 may include the active region 105 disposed in the upper portion thereof. The active region 105 may be defined by the device isolation layer 110 within the substrate 101 and may be disposed to extend in a first direction, for example, an X-direction. However, depending on the description method, it is also possible to describe the active region 105 as a separate configuration from the substrate 101. The active region 105 partially protrudes upwardly of the device isolation layer 110, and thus, the upper surface of the active region 105 may be located at a higher level than the upper surface of the device isolation layer 110. The active region 105 may be formed of a portion of the substrate 101 or may include an epitaxial layer grown from the substrate 101. However, on both sides of the gate structure 160, the active region 105 is partially recessed to form recess regions, and source/drain regions 150 may be disposed in the recess regions.

In example embodiments, the active region 105 may or may not include a well region containing impurities. For example, in the case of a P-type transistor (pFET), the well region may include N-type impurities such as phosphorus (P), arsenic (As), or antimony (Sb), and in the case of the N-type transistor (nFET), the well region may include P-type impurities such as boron (B), gallium (Ga), or indium (In). The well region may be located, for example, at a predetermined depth from the upper surface of the active region 105.

The device isolation layer 110 may define the active region 105 in the substrate 101. The device isolation layer 110 may be formed by, for example, a shallow trench isolation (STI) process. The device isolation layer 110 may expose an upper surface of the active region 105 or partially expose an upper portion of the active region 105. In some embodiments, the device isolation layer 110 may have a curved upper surface such that the device isolation layer 110 has a higher level as it is closer to the active region 105. That is, the device isolation layer 110 may be formed to extend higher in the Z-direction at portions closer to the active region 105. The device isolation layer 110 may be formed of an insulating material. The device isolation layer 110 may be, for example, oxide, nitride, or a combination thereof.

The channel structures 140 may be disposed on the active region 105 in regions where the active region 105 intersects the gate structures 160. Each of the channel structures 140 may include first to fourth channel layers 141, 142, 143, and 144 that are a plurality of channel layers spaced apart from each other in the Z-direction. The first to fourth channel layers 141, 142, 143, and 144 may be sequentially disposed from the active region 105. The channel structures 140 may be connected to the source/drain regions 150.

Among the first to fourth channel layers 141, 142, 143, and 144, the fourth channel layer 144 disposed on the uppermost portion may have a shape in which a portion including the center thereof is removed. The fourth channel layer 144 may include channel portions 144P1 and 144P2 separated from each other and spaced apart from each other in the X-direction. The channel portions 144P1 and 144P2 may be positioned below edge regions or ends of both sides of the gate structure 160 in a cross section in the X-direction. The channel portions 144P1 and 144P2 may be located at substantially the same level as each other. The fourth channel layer 144 may have a shape in which a region including a center thereof in an X-direction, perpendicular to the extension direction of the gate structure 160, is removed, and the removed region may extend in a Y-direction. Accordingly, the channel portions 144P1 and 144P2 may also have a shape extending in the Y-direction while being positioned on the active region 105. The channel portions 144P1 and 144P2 may be respectively disposed outside from the vertical central axis of the gate structure 160 in the X-direction. The channel portions 144P1 and 144P2 may not, in an example embodiment, vertically overlap the central region of the gate electrode layer 165 in the X-direction.

Outer side surfaces of the channel portions 144P1 and 144P2 may contact the source/drain regions 150, and inner side surfaces of the channel portions 144P1 and 144P2 may be covered with the gate dielectric layer 162. Functional channel regions of transistors may be formed along regions adjacent to the inner side surfaces of the channel portions 144P1 and 144P2. However, in some embodiments, the fourth channel layer 144 may not substantially function as a channel region of a transistor, depending on the recessed depth of the contact plugs 180, the remaining shape of the channel portions 144P1 and 144P2, or the like.

The channel portions 144P1 and 144P2 may be disposed below the gate spacer layers 164 and may be disposed below the cover insulating layers 107. In each of the channel portions 144P1 and 144P2, at least a portion of the upper surface may contact the cover insulating layers 107 and at least a portion of the lower surface may contact the inner spacer layers 130. In some embodiments, the cover insulating layers 107 may be omitted, and in an example embodiment, the channel portions 144P1 and 144P2 may contact the gate spacer layers 164.

As illustrated in FIG. 3, each of the channel portions 144P1 and 144P2 may have a first length L1 in the X-direction. The first length L1 may be smaller than a second length L2 of the first to third channel layers 141, 142, and 143 therebelow. For example, the first length L1 may be less than half of the second length L2. For example, the first length L1 may be in a range of from about 1% to about 30% of the second length L2. The channel portions 144P1 and 144P2 may protrude toward the gate electrode layer 165 rather than inner side surfaces of the gate spacer layers 164. The channel portions 144P1 and 144P2 may protrude by a third length L3 from inner side surfaces of adjacent inner spacer layers 130 toward the gate electrode layer 165. The third length L3 may be less than the first length L1 and the second length L2. The relative size of the third length L3 may vary in example embodiments.

In the channel structures 140, the first to third channel layers 141, 142, and 143 may have the second length L2 equal to or similar to a length of the gate structures 160 in the X-direction, and may have a width equal to or smaller than a width of the active region 105 in the Y-direction. In a cross section in the Y-direction, a lower channel layer among the first to third channel layers 141, 142, and 143 may have a width equal to or larger than a width of an upper channel layer. As such, since the uppermost fourth channel layer 144 has a form in which a portion thereof is removed, parasitic capacitance of the semiconductor device 100 may be reduced, and thus AC performance and power characteristics may be improved. Also, according to the capacitance reduction, the length of the channel structure 140 in the X-direction may be minimized.

The number and shape of channel layers constituting one channel structure 140 may be vary in example embodiments. In some embodiments, the channel structure 140 may have a shape in which the length in the X-direction increases as the channel layer is closer to the active region 105. In example embodiments, the shapes and relative widths and lengths of side surfaces of the first to fourth channel layers 141, 142, 143, and 144 may vary, and the shapes and lengths of the side surfaces in various example embodiments are not limited to the shape and lengths illustrated in FIG. 2.

The channel structures 140 may be formed of a semiconductor material, and may include, for example, at least one of silicon (Si), silicon germanium (SiGe), and germanium (Ge). The channel structures 140 may be formed of, for example, the same material as a material of the active region 105. In some embodiments, the channel structures 140 may include impurity regions positioned adjacent to the source/drain regions 150.

The source/drain regions 150 may be disposed in recess regions in which an upper portion of the active region 105 is partially recessed on both sides of the gate structure 160. The source/drain regions 150 may be disposed to cover respective outer side surfaces of the first to fourth channel layers 141, 142, 143, and 144 of the channel structures 140 in the X-direction. The upper surfaces of the source/drain regions 150 may be located at the same or similar height as the lower surfaces of the gate electrode layers 165 on the channel structures 140, and the height may vary in example embodiments. The source/drain regions 150 may include a semiconductor material, for example, at least one of silicon (Si) and germanium (Ge), and may further include impurities.

The inner spacer layers 130 may be disposed parallel to the gate electrode layer 165, between the first to fourth channel layers 141, 142, 143, and 144, in the Z-direction. The gate electrode layer 165 may be stably spaced apart and electrically separated from the source/drain regions 150 by the inner spacer layers 130. The inner spacer layers 130 may have a shape in which inner side surfaces thereof facing the gate electrode layer 165 are convexly rounded inward toward the gate electrode layer 165, but example embodiments are not limited thereto. The inner spacer layers 130 may be formed of oxide, nitride, or oxynitride, and in detail, may be formed of a low-k film. However, according to example embodiments, the inner spacer layers 130 may be omitted.

The gate structures 160 may be disposed on the active region 105 and the channel structures 140 to cross the active region 105 and the channel structures 140 and extend in a second direction, for example, in the Y-direction. Functional channel regions of the transistors may be formed in the active regions 105 and/or the channel structures 140 crossing the gate electrode layers 165 of the gate structures 160. Each of the gate structures 160 includes the gate electrode layer 165, the gate dielectric layers 162 between the gate electrode layer 165 and the first to fourth channel layers 141, 142, 143 and 144, and the gate spacer layers 164 on side surfaces of the gate electrode layer 165. In example embodiments, each of the gate structures 160 may further include a capping layer on an upper surface of the gate electrode layer 165. Alternatively, a portion of the interlayer insulating layer 190 on the gate structure 160 may be referred to as a gate capping layer.

The gate dielectric layers 162 may be disposed between the active region 105 and the gate electrode layer 165 and between the channel structure 140 and the gate electrode layer 165, and may be disposed on and to cover at least a portion of the surfaces of the gate electrode layer 165. For example, the gate dielectric layers 162 may be disposed on and to surround all surfaces of the gate electrode layer 165 except for an uppermost surface. The gate dielectric layers 162 may extend between the gate electrode layer 165 and the gate spacer layers 164, but are not limited thereto. The gate dielectric layers 162 may include an oxide, nitride, or a high-κ material. The high-ic material may refer to a dielectric material having a higher dielectric constant than a dielectric constant of silicon oxide ($SiO_2$). The high-k material may be any one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). According to example embodiments, the gate dielectric layer 162 may be formed of a multilayer film.

The gate electrode layer 165 may extend onto the channel structure 140 and may, in an example embodiment, fill a gap between the first to fourth channel layers 141, 142, 143, and 144, on the active region 105. The gate electrode layer 165 may be spaced apart from the first to fourth channel layers 141, 142, 143, and 144 by the gate dielectric layers 162.

The gate electrode layer 165 may extend downwardly from above the fourth channel layer 144 toward the third channel layer 143 along between the channel portions 144P1 and 144P2 of the fourth channel layer 144, in the cross section in the X-direction. The gate electrode layer 165 may extend between inner side surfaces of the channel portions 144P1 and 144P2 along with the gate dielectric layer 162 in a cross section in the X-direction. In an example embodiment, in the gate electrode layer 165, a length thereof between the inner side surfaces of the channel portions 144P1 and 144P2 may be smaller than a length on the upper surface of the third channel layer 143. As illustrated in FIG. 2, in a cross section in the X-direction, the gate electrode layer 165 may include a plurality of regions spaced apart in the Z-direction. Among the regions, a lower surface of the uppermost region may be positioned at a level lower than the upper surfaces of the source/drain regions 150 and the upper surface of the fourth channel layer 144.

The gate electrode layer 165 may include a conductive material, and for example, may include a metal nitride such as titanium nitride (TiN), tantalum nitride (TaN), or tungsten nitride (WN), and/or a metal material such as aluminum (Al), tungsten (W) or molybdenum (Mo), or a semiconductor material such as doped polysilicon. According to example embodiments, the gate electrode layer 165 may be comprised of two or more multi-layers.

The gate spacer layers 164 may be disposed on both sides of the gate electrode layer 165, on the channel structure 140. The gate spacer layers 164 may insulate the source/drain regions 150 and the gate electrode layer 165. The gate spacer layers 164 may be formed of a multilayer structure according to example embodiments. The gate spacer layers 164 may be formed of oxide, nitride, or oxynitride, and in detail, may be formed of a low-k film.

The cover insulating layers 107 may be disposed between the gate spacer layers 164 and the fourth channel layer 144. The cover insulating layers 107 may include an insulating material, and may be formed of, for example, oxide, nitride, or oxynitride. However, according to example embodiments, the cover insulating layers 107 may be omitted, or the boundary thereof with the gate spacer layers 164 may not be distinguished.

The interlayer insulating layer 190 may be disposed to cover the source/drain regions 150 and the gate structures 160 and to cover the device isolation layer 110. The interlayer insulating layer 190 may include at least one of oxide, nitride, or oxynitride, and may include, for example, a low-k material. According to example embodiments, the interlayer insulating layer 190 may include a plurality of insulating layers.

The contact plugs 180 may pass through the interlayer insulating layer 190 and be connected to the source/drain regions 150 and may apply electrical signals to the source/drain regions 150. The contact plugs 180 may have inclined side surfaces of which the width of the lower portion is narrower than the width of the upper portion according to the aspect ratio, but example embodiments are not limited thereto. The contact plugs 180 may extend downwardly from the upper portion to be lower than the lower surface of the fourth channel layer 144 that is an upper most layer of the channel structure 140, but example embodiments are not limited thereto. In some embodiments, the contact plugs 180 may be disposed to contact along upper surfaces of the source/drain regions 150 without recessing the source/drain regions 150.

Each of the contact plugs 180 may include a metal silicide layer positioned at a lower end including a lower surface, and may further include a barrier layer forming side surfaces of the contact plug 180 and extending onto an upper surface of the metal silicide layer. The barrier layer may include, for example, a metal nitride such as titanium nitride (TiN), tantalum nitride (TaN), or tungsten nitride (WN). The contact plugs 180 may include, for example, a metal material such as aluminum (Al), tungsten (W), or molybdenum (Mo). In example embodiments, the number and arrangement of conductive layers constituting the contact plugs 180 may vary. An interconnection structure such as a contact plug may be further disposed on the gate electrode layer 165, and an interconnection structure connected to the contact plugs 180 may be further disposed on the contact plugs 180.

In the description of the following embodiments, descriptions overlapping those described above with reference to FIGS. 1 to 3 will be omitted.

Figure 4A:
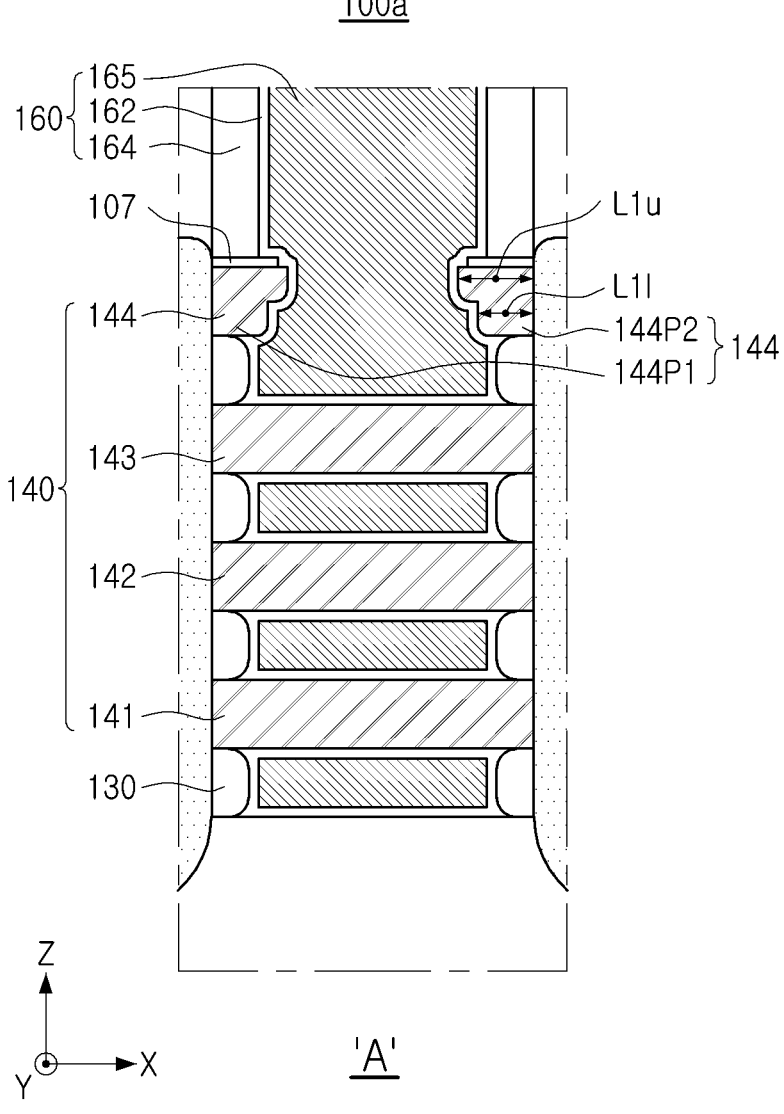
FIGS. 4A to 4C are partially enlarged views of a semiconductor device according to example embodiments.
Figure 4B:
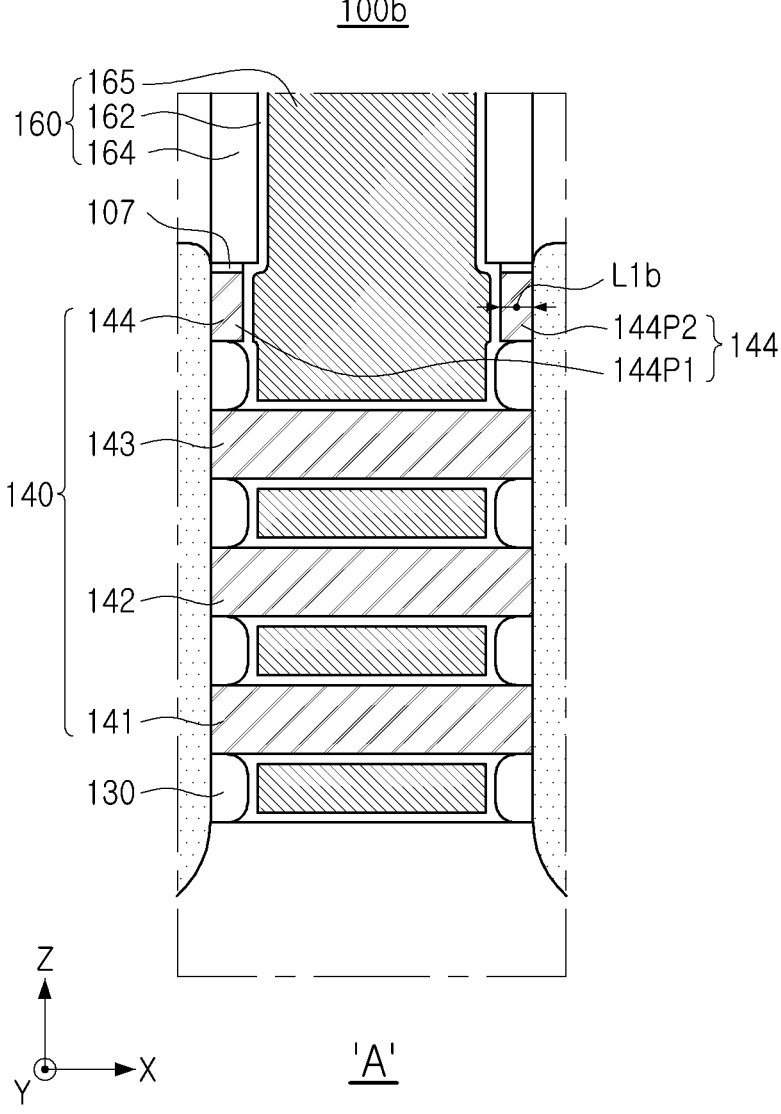
Figure 4C:
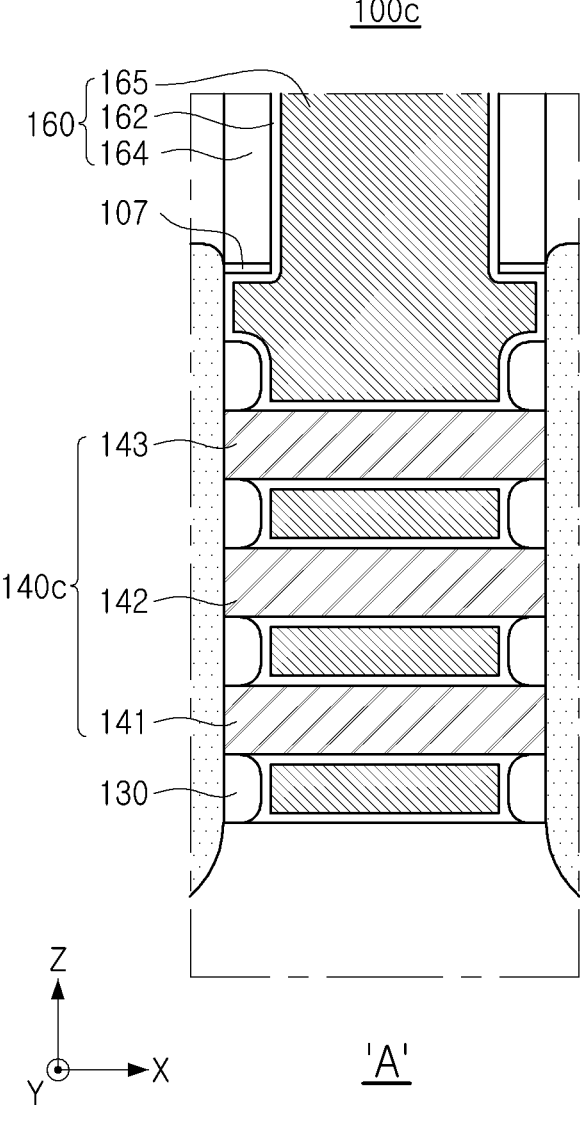

FIGS. 4A to 4C are partially enlarged views of a semiconductor device according to example embodiments. FIGS. 4A to 4C respectively illustrate areas corresponding to FIG. 3.

Referring to FIG. 4A, in a semiconductor device 100a, the shape of the fourth channel layer 144 may be different from that of the example embodiment of FIG. 3. Each of the channel portions 144P1 and 144P2 of the fourth channel layer 144 may have an asymmetric shape in an upper region and a lower region in the Z-direction. For example, each of the channel portions 144P1 and 144P2 of the fourth channel layer 144 may have a shape in which a length L1u in the upper region is greater than a length L11 in the lower region in the X-direction.

This shape may be formed according to etching conditions in a process of removing the central region of the fourth channel layer 144. In example embodiments, a relative length of the upper region and the lower region, a shape at a boundary between the upper region and the lower region, or the like may be variously changed.

Referring to FIG. 4B, in the fourth channel layer 144 of a semiconductor device 100b, the position of inner side surfaces facing the gate electrode layer 165 may be different from that in the example embodiment of FIG. 3. The inner side surfaces of the channel portions 144P1 and 144P2 may be positioned the same as or further outward than inner side surfaces of the gate spacer layers 164 and/or the inner spacer layers 130. The inner side surfaces of the channel portions 144P1 and 144P2 may not protrude toward the gate electrode layer 165, compared to the gate spacer layers 164 and/or the inner spacer layers 130. A length L1b of each of the channel portions 144P1 and 144P2 of the fourth channel layer 144 in the X-direction may be the same as or similar to the length of the inner spacer layers 130. In this embodiment, the length of the gate electrode layer 165 between channel portions 144P1 and 144P2 may be substantially equal to or greater than the length of the gate electrode layer 165 on the upper surface of the third channel layer 143.

This shape may be formed according to etching conditions in a process of removing the central region of the fourth channel layer 144. As such, in different example embodiments, the shape and degree of protruding or outwardly recessed inner side surfaces of the channel portions 144P1 and 144P2 may vary. In addition, the shapes of the cover insulating layers 107 on the channel portions 144P1 and 144P2 may vary.

Referring to FIG. 4C, in a semiconductor device 100*c*, a channel structure 140*c* of the example embodiment may not include the fourth channel layer 144 (see FIG. 3). In this embodiment, the entirety of the fourth channel layer 144 may be removed and may not remain. Accordingly, the gate dielectric layer 162 and the gate electrode layer 165 may be extended along the upper surfaces of the uppermost inner spacer layers 130, the side surfaces of the source/drain regions 150, and the lower surfaces of the cover insulating layers 107. The gate electrode layer 165 may have a maximum length on the uppermost inner spacer layers 130, a region from which the fourth channel layer 144 has been removed.

In this manner, in example embodiments, the entirety of the fourth channel layer 144 may be removed, and the degree to which the fourth channel layer 144 is removed may be variously changed.

Figure 5:
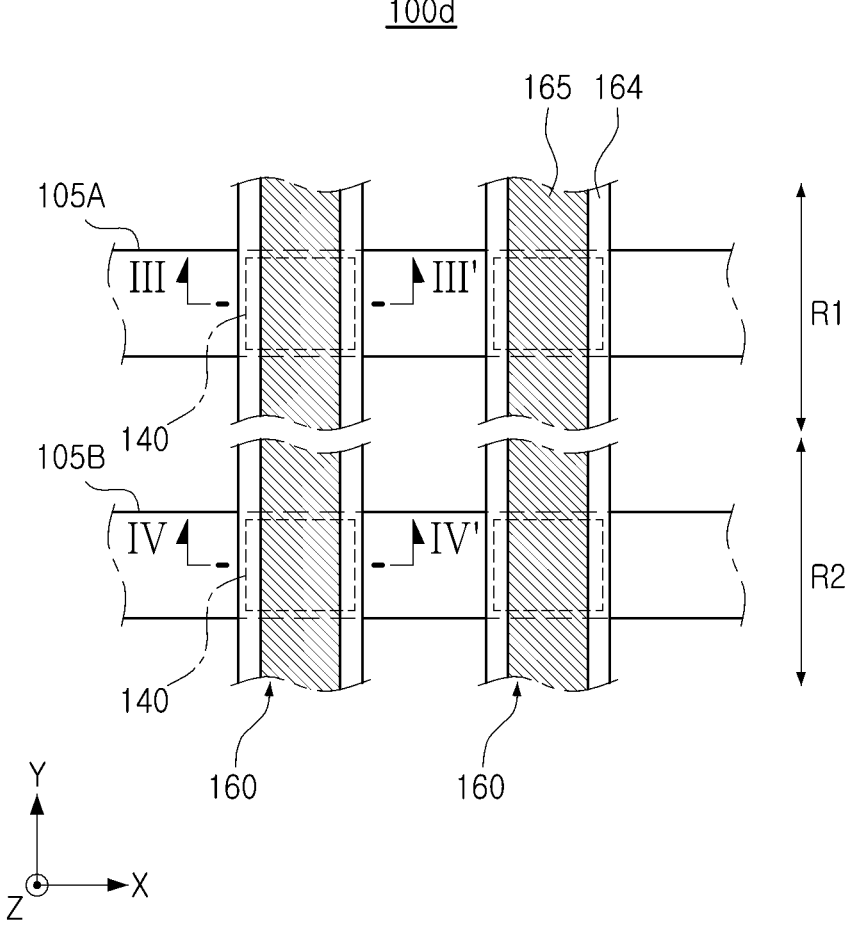
FIG. 5 is a plan view illustrating a semiconductor device according to example embodiments.

FIG. 5 is a plan view illustrating a semiconductor device according to example embodiments.

Figure 6:
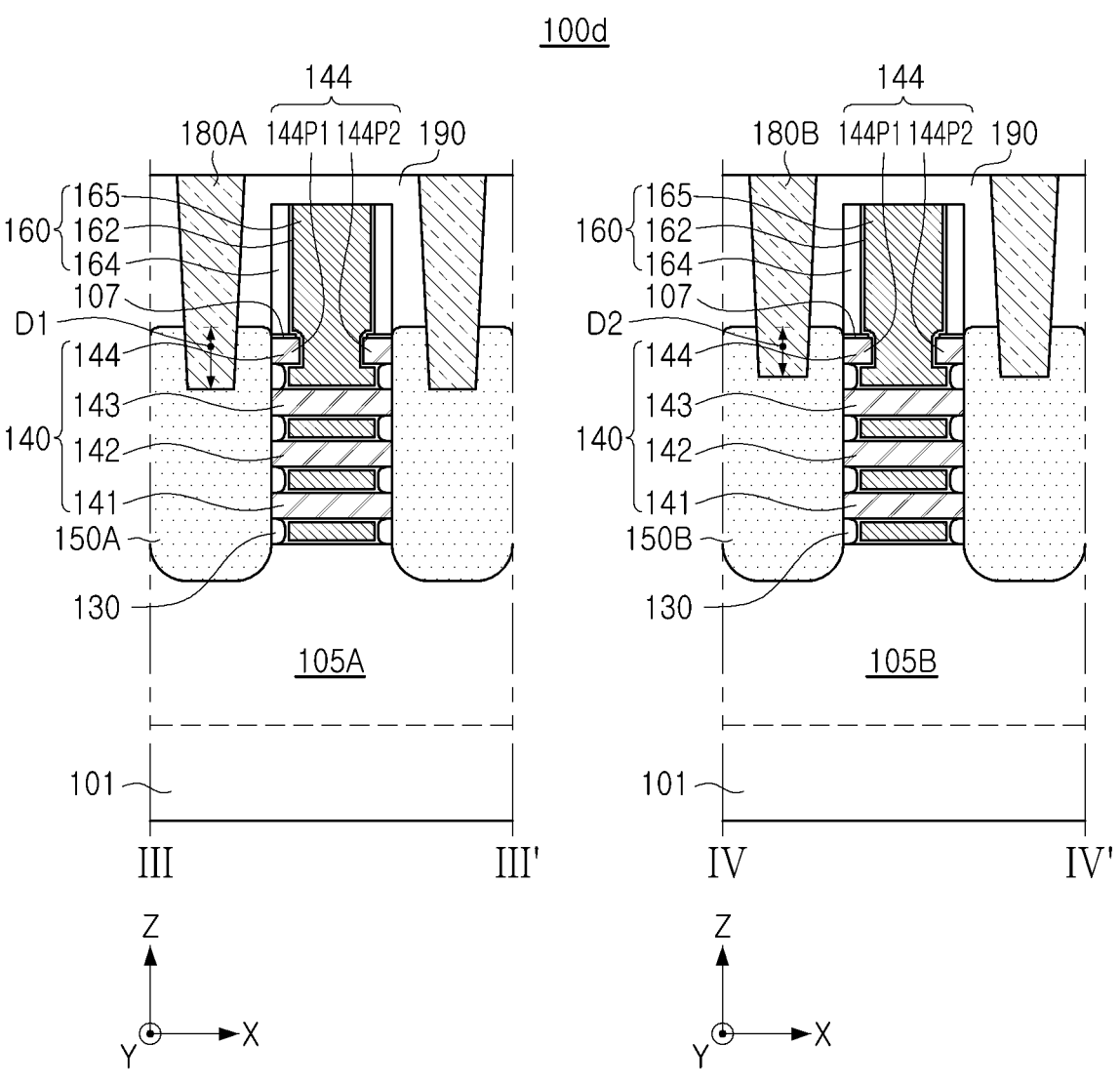
FIG. 6 is a cross-sectional view illustrating a semiconductor device according to example embodiments.

FIG. 6 is a cross-sectional view illustrating a semiconductor device according to example embodiments. FIG. 6 illustrates cross-sections of the semiconductor device of FIG. 5 taken along cutting lines and IV-IV'. For convenience of description, only some components of the semiconductor device are illustrated in FIG. 5.

Referring to FIGS. 5 and 6, a semiconductor device 100*d* may include first and second regions R1 and R2. The first and second regions R1 and R2 may be adjacent to or spaced apart from each other. A first active region 105A, first source/drain regions 150A, and first contact plugs 180A are disposed in a first region R1, and a second active region 105B, second source/drain regions 150B, and second contact plugs 180B may be disposed in a second region R2. Other components including the gate structures 160 may be disposed in the first and second regions R1 and R2, respectively. For example, the first region R1 may be a region in which a pFET is disposed, and the second region R2 may be a region in which an nFET is disposed. In other embodiments, the first and second regions R1 and R2 may be regions in which transistors having the same conductivity type and different electrical characteristics are disposed.

The first and second active regions 105A and 105B may each include a well region containing impurities. For example, in the first active region 105A of the first region R1 where the pFET is disposed, the well region may include N-type impurities such as phosphorus (P), arsenic (As), or antimony (Sb). In the second active region 105B of the second region R2 where the nFET is disposed, the well region may include P-type impurities such as boron (B), gallium (Ga), or aluminum (Al).

The first and second source/drain regions 150A and 150B may have the same or different internal structures. The first and second source/drain regions 150A and 150B may include different materials. For example, the germanium (Ge) concentration of the first source/drain regions 150A may be higher than the germanium (Ge) concentration of the second source/drain regions 150B. For example, the first source/drain regions 150A may include a silicon germanium (SiGe) epitaxial layer, and the second source/drain regions 150B may include a silicon (Si) epitaxial layer. In some embodiments, the second source/drain regions 150B may not include a silicon germanium (SiGe) epitaxial layer. The first and second source/drain regions 150A and 150B may include impurities of different conductivity types. For example, the first source/drain regions 150A may include the P-type impurities, and the second source/drain regions 150B may include the N-type impurities.

In the first and second regions R1 and R2, the channel structures 140 may have the same structure. In the channel structure 140, the uppermost fourth channel layer 144 may include channel portions 144P1 and 144P2 spaced apart in the X-direction, as described above with reference to FIGS. 1 to 3.

The first and second contact plugs 180A and 180B may be disposed by respectively recessing the first and second source/drain regions 150A and 150B at different depths. The first contact plugs 180A may be disposed to recess the first source/drain regions 150A to a first depth D1, and the second contact plugs 180B may be disposed to recess the second source/drain regions 150B to a second depth D2 smaller than the first depth D1. The difference in recess depth may be due to a difference in material between the first source/drain regions 150A and the second source/drain regions 150B. In this embodiment, even if the first contact plugs 180A are recessed relatively deeply, since the uppermost fourth channel layer 144 is not substantially used as a channel region of the transistor, the electrical properties required in the semiconductor device 100 may not be affected. Accordingly, a process of forming the first contact plugs 180A may be relatively easy.

Figure 7A:
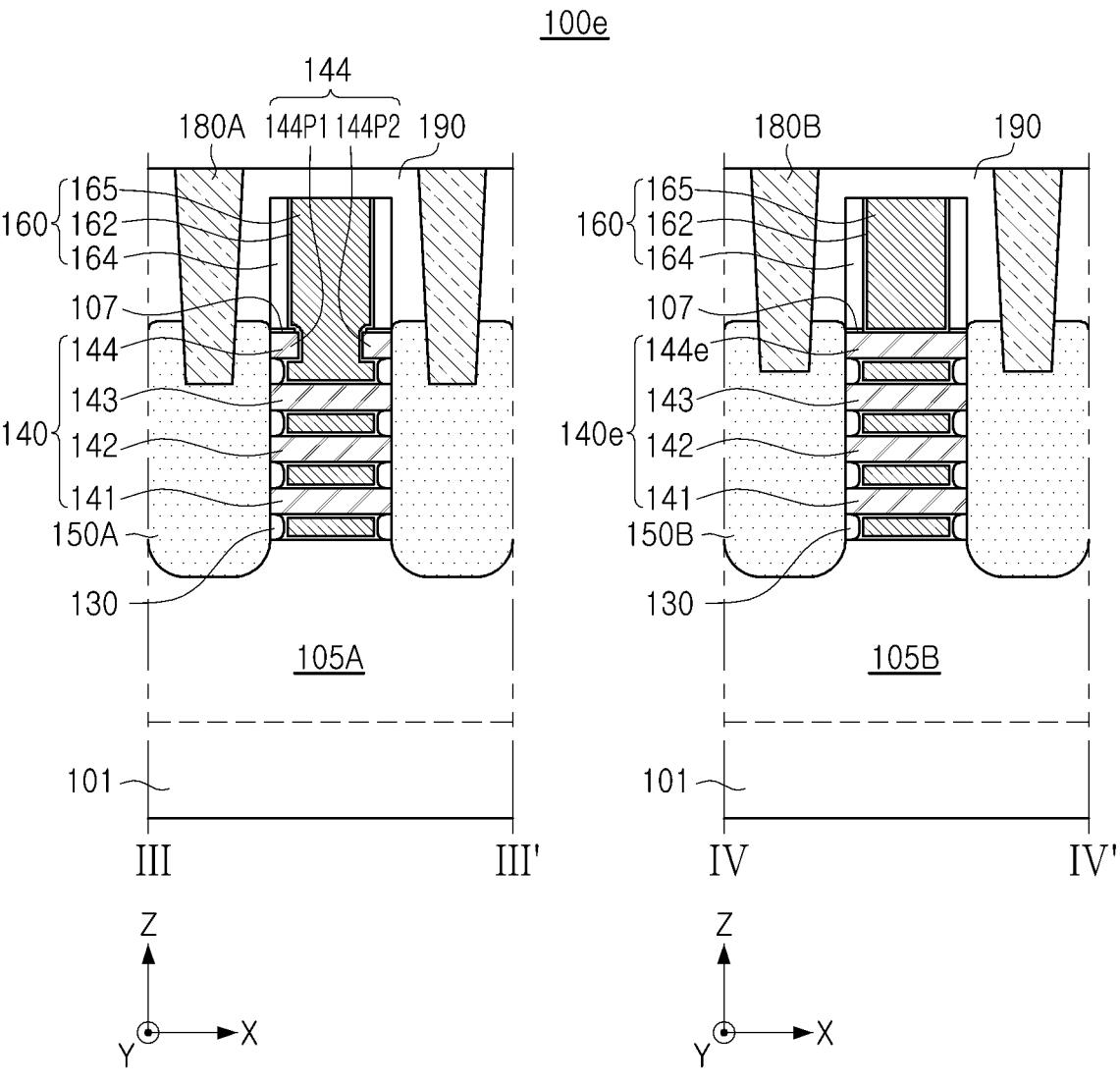
FIGS. 7A and 7B are cross-sectional views illustrating a semiconductor device according to example embodiments.
Figure 7B:
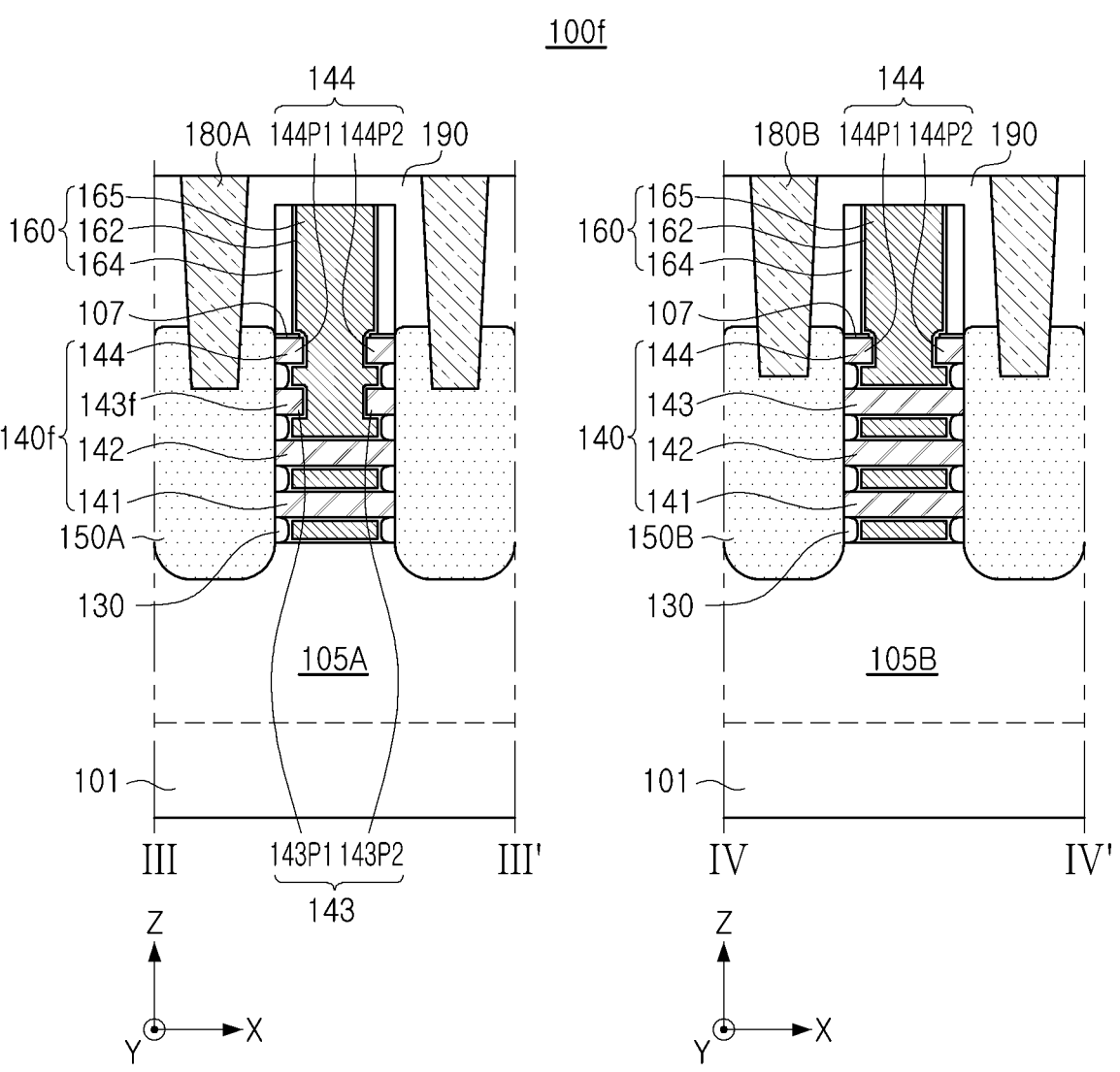

FIGS. 7A and 7B are cross-sectional views illustrating a semiconductor device according to example embodiments. FIGS. 7A and 7B respectively illustrate areas corresponding to FIG. 6.

Referring to FIG. 7A, in first and second regions R1 and R2 of a semiconductor device 100*e*, channel structures 140 and 140*e* may have different structures. In the first region R1, the fourth channel layer 144 of the channel structure 140 may include channel portions 144P1 and 144P2 as in the example embodiment of FIG. 6. Unlike the channel structure 140 in the first region R1, the fourth channel layer 144*e* of the channel structure 140*e* in the second region R2 may be disposed as a single layer. The fourth channel layer 144*e* may not include the channel portions 144P1 and 144P2 and may have the same shape as the first to third channel layers 141, 142 and 143. Accordingly, the fourth channel layer 144*e* may vertically overlap the central region of the gate electrode layer 165 in the X-direction.

Referring to FIG. 7B, in first and second regions R1 and R2 of a semiconductor device 100*f*, the channel structures 140*f* and 140 may have different structures. The third channel layer 143 of the channel structure 140*f* in the first region R1 may include channel portions 143P1 and 143P2 spaced apart from each other, similarly to the aforementioned fourth channel layer 144. In the second region R2, the fourth channel layer 144 of the channel structure 140 may include channel portions 144P1 and 144P2 as in the example embodiment of FIG. 6.

The description of the channel portions 144P1 and 144P2 of the fourth channel layer 144 may be equally applied to the channel portions 143P1 and 143P2 of the third channel layer 143 of the channel structure 140*f* In example embodiments, the number of channel layers disposed as the channel portions as described above may be variously changed.

In the example embodiments of FIGS. 7A and 7B, the number of substantial channel layers in the first region R1 and the second region R2 may be different. A "substantial channel layer" may mean, for example, a channel layer having a length greater than or equal to a predetermined length or a channel layer disposed as one layer. For example, the number of channel layers having a predetermined length in the transistor of the pFET region, which is the first region R1, may be less than the number of channel layers having a predetermined length in the transistor of the nFET region, which is the second region R2. In this case, a capacitance gain of the semiconductor devices 100e and 100f may be secured by the pFET region, and a process margin of the forming process of the first contact plugs 180A may be secured.

Figure 8:
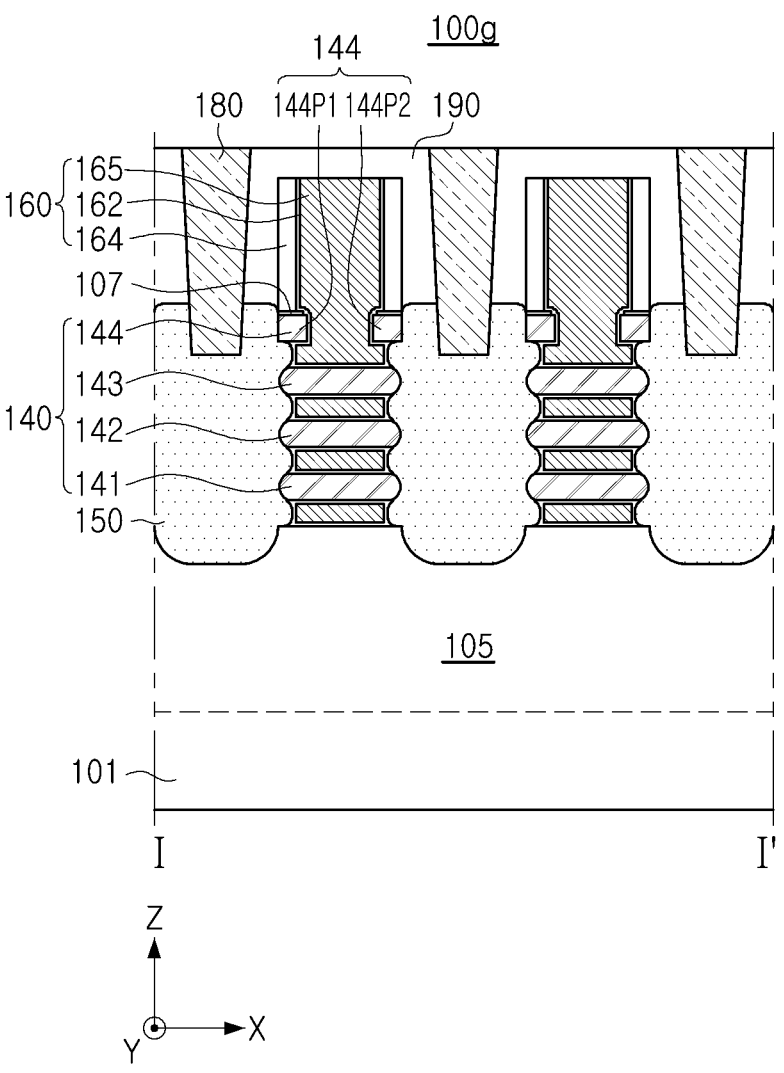
FIG. 8 is a cross-sectional view illustrating a semiconductor device according to example embodiments.

FIG. 8 is a cross-sectional view illustrating a semiconductor device according to example embodiments. FIG. 8 illustrates an area corresponding to the left section of FIG. 2.

Referring to FIG. 8, a semiconductor device 100g may not include the inner spacer layer 130, unlike the example embodiment of FIG. 2. In this example embodiment, the source/drain regions 150 may have an extending shape by the region where the inner spacer layers 130 are omitted. The gate electrode layer 165 may be spaced apart from the source/drain regions 150 by the gate dielectric layers 162. In another embodiment, the source/drain regions 150 may not extend to regions where the inner spacer layers 130 are omitted, and the gate electrode layer 165 may be disposed to extend in the X-direction.

According to an example embodiment including such a structure, since the inner spacer layer 130 is omitted, the source/drain regions 150 may have improved crystallinity during growth of the source/drain regions 150. In some embodiments, the inner spacer layer 130 may be omitted only in some transistors of the semiconductor device 100g.

Figure 9:
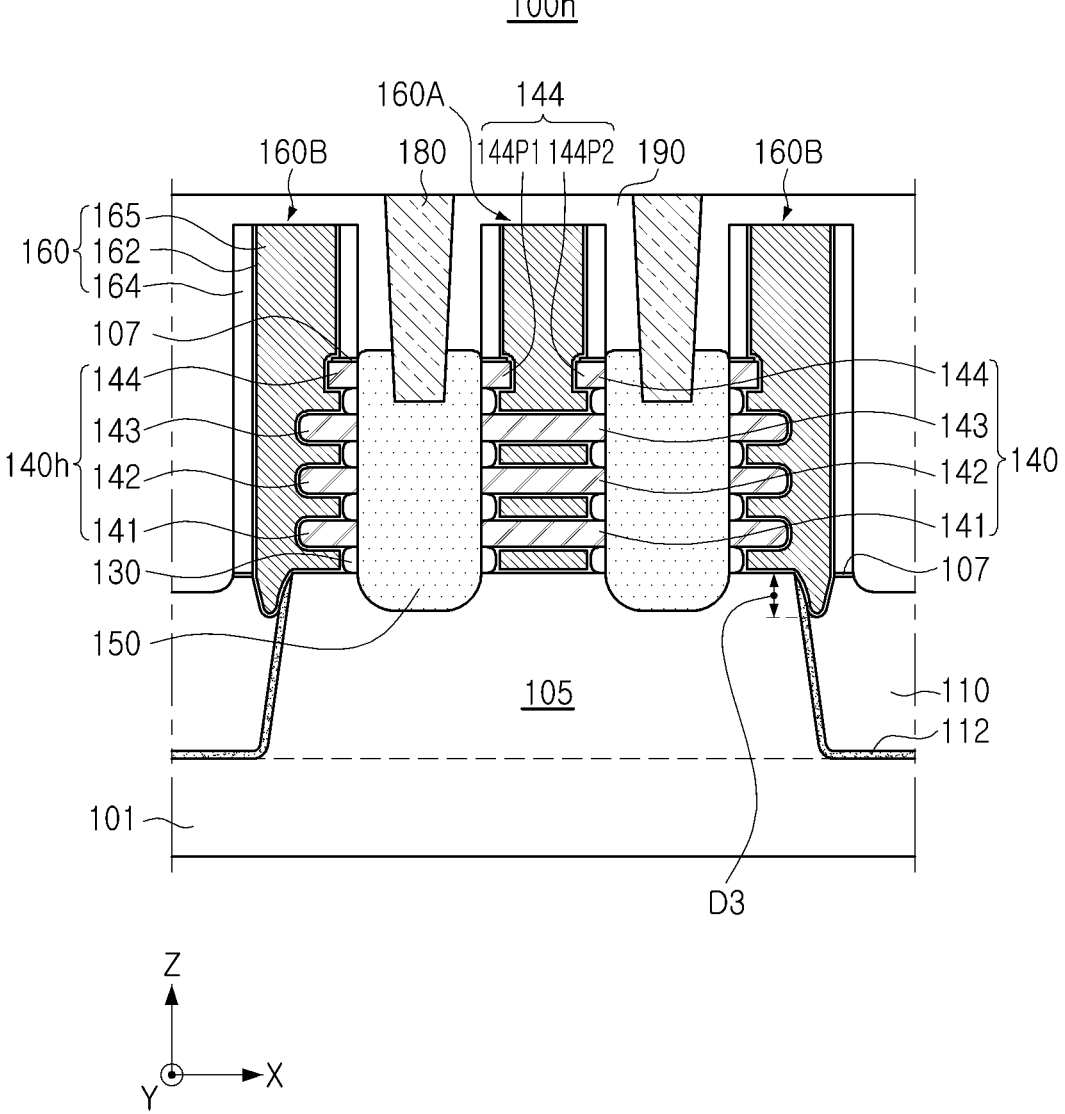
FIG. 9 is a cross-sectional view illustrating a semiconductor device according to example embodiments.

FIG. 9 is a cross-sectional view illustrating a semiconductor device according to example embodiments.

Referring to FIG. 9, in a semiconductor device 100h, the gate structures 160 may include first and second gate structures 160A and 160B, and the semiconductor device 100h may further include a liner layer 112.

The description described above with reference to FIG. 2 may be equally applied to the first gate structure 160A. The second gate structures 160B may have a shape in which left and right regions with respect to a vertical central axis in a cross section in the X-direction are asymmetrical. The second gate structures 160B may be gate structures constituting transistors or dummy gate structures not constituting transistors.

The second gate structures 160B may cross ends of the active region 150. The second gate structures 160B may protrude outward from the end of the active region 150 toward the device isolation layer 110 in the X-direction. At least a portion of the second gate structures 160B may contact the device isolation layer 110. The second gate structures 160B may include a region protruding downward toward the device isolation layer 110. Accordingly, lower ends of the second gate structures 160B may be positioned at a lower level than lower ends of the first gate structures 160A. The shape of the second gate structures 160B may be due to a partial removal of the device isolation layer 110 during the process of partially removing the fourth channel layer 144. The depth D3 at which the lower ends of the second gate structures 160B extend downwardly from the upper surface of the active region 105 may vary in example embodiments.

Each of the gate electrode layers 165 of the second gate structures 160B may include adjacent inner and outer regions in the X-direction. The inner region may have a shape similar to the shape of the gate electrode layer 165 of the first gate structure 160A. The outer region may be a region in which the gate electrode layer 165 continuously extends in the Z-direction. In the outer region, the gate electrode layer 165 may have a shape in which regions between the first to third channel layers 141, 142, and 143 and an upper region of the third channel layer 143 are connected to each other. The gate electrode layer 165 may have a region protruding downwardly toward the device isolation layer 110 in the outer region.

In the second gate structures 160B, the gate spacer layers 164 on respective sides thereof, adjacent to the device isolation layer 110, may extend downwardly past the side surfaces of the channel structure 140, and at least a portion thereof may be in contact with the cover insulating layers 107 or the device isolation layer 110. In the second gate structures 160B, inner spacer layers 130 may not be disposed on side surfaces of the gate electrode layers 165 adjacent to the device isolation layer 110.

The channel structure 140h surrounded by the second gate structures 160B may have a shape corresponding to a left area or a right area of the channel structure 140 surrounded by the first gate structure 160A. Accordingly, the channel structure 140h may include any one of the channel portions 144P1 and 144P2 constituting the fourth channel layer 144, and the first to third channel layers 141, 142 and 143 of the channel structure 140h may have the shape of a relatively short extension in the X-direction. In the channel structure 140h, the lengths of the first to third channel layers 141, 142, and 143 in the X-direction may be greater than the length of the fourth channel layer 144, but example embodiments are not limited thereto.

The liner layer 112 may be positioned along an inner wall of the trench in which the device isolation layer 110 is positioned and may extend with a relatively thin thickness. The liner layer 112 may be, for example, a layer for curing the exposed surface of the substrate 101 after formation of the trenches. The liner layer 112 may include an insulating material different from a material of the device isolation layer 110, and may include, for example, silicon nitride or silicon oxynitride. An upper end of the liner layer 112 may contact the gate dielectric layers 162 of the second gate structures 160B.

In some embodiments, the semiconductor device 100h may be additionally disposed in a partial area of the semiconductor device of other embodiments.

FIGS. 10A to 10I are views illustrating a process sequence to describe a method of manufacturing a semiconductor device according to example embodiments. FIGS. 10A to 10I illustrate an example embodiment of a method of manufacturing the semiconductor device of FIG. 2.

Figure 10A:
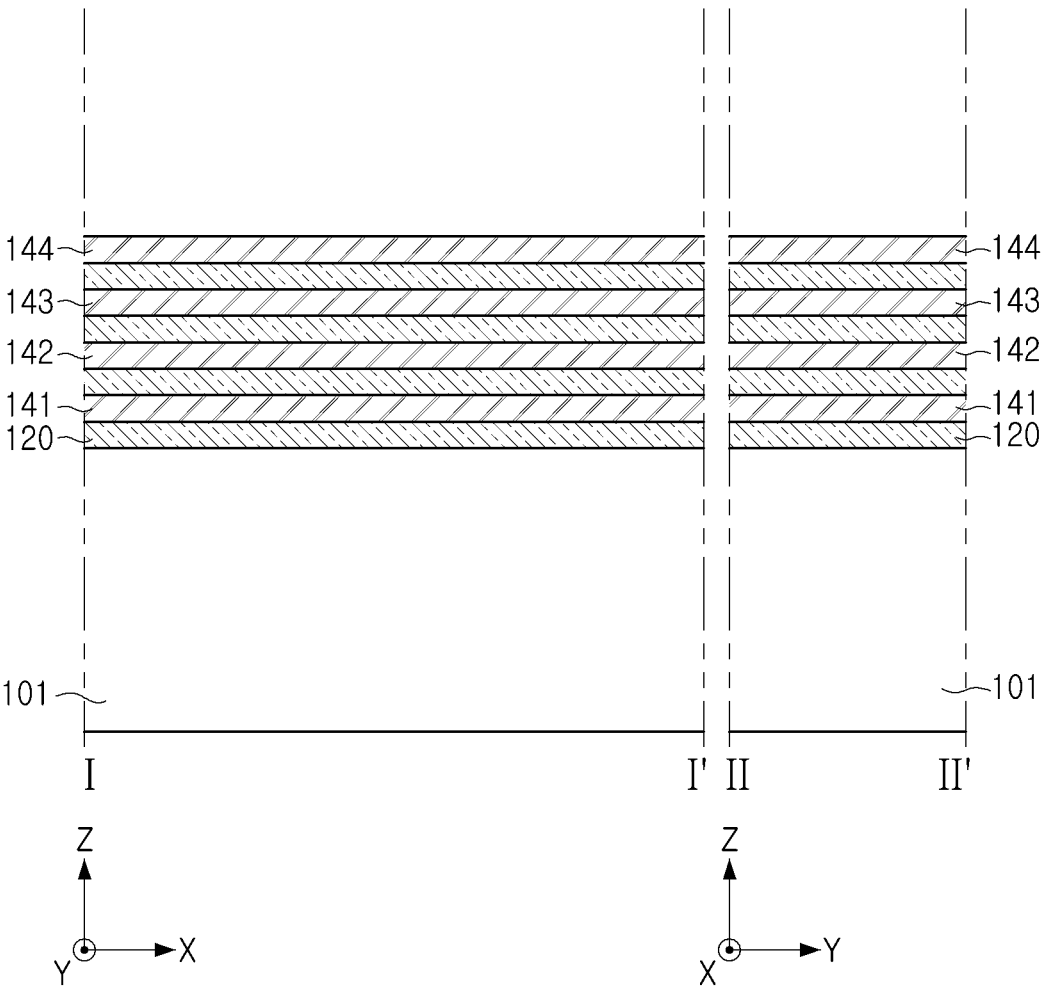
FIGS. 10A to 10I are views illustrating a process sequence to describe a method of manufacturing a semiconductor device according to example embodiments.

Referring to FIG. 10A, sacrificial layers 120 and first to fourth channel layers 141, 142, 143, and 144 may be alternately stacked on a substrate 101.

The sacrificial layers 120 may be replaced with the gate dielectric layers 162 and the gate electrode layers 165 below the fourth channel layer 144 through a subsequent process, as illustrated in FIG. 2. The sacrificial layers 120 may be formed of a material having etch selectivity with respect to the first to fourth channel layers 141, 142, 143, and 144 respectively. The first to fourth channel layers 141, 142, 143, and 144 may include a material different from a material of the sacrificial layers 120. The sacrificial layers 120 and the first to fourth channel layers 141, 142, 143, and 144 include a semiconductor material including, for example, at least one of silicon (Si), silicon germanium (SiGe), or germanium (Ge), but may include different materials, and may or may not include impurities. For example, the sacrificial layers 120 may include silicon germanium (SiGe), and the first to fourth channel layers 141, 142, 143, and 144 may include silicon (Si).

The sacrificial layers 120 and the first to fourth channel layers 141, 142, 143, and 144 may be formed by performing an epitaxial growth process. The number of layers of the channel layers alternately stacked with the sacrificial layers 120 may be variously changed in the example embodiments.

Figure 10B:
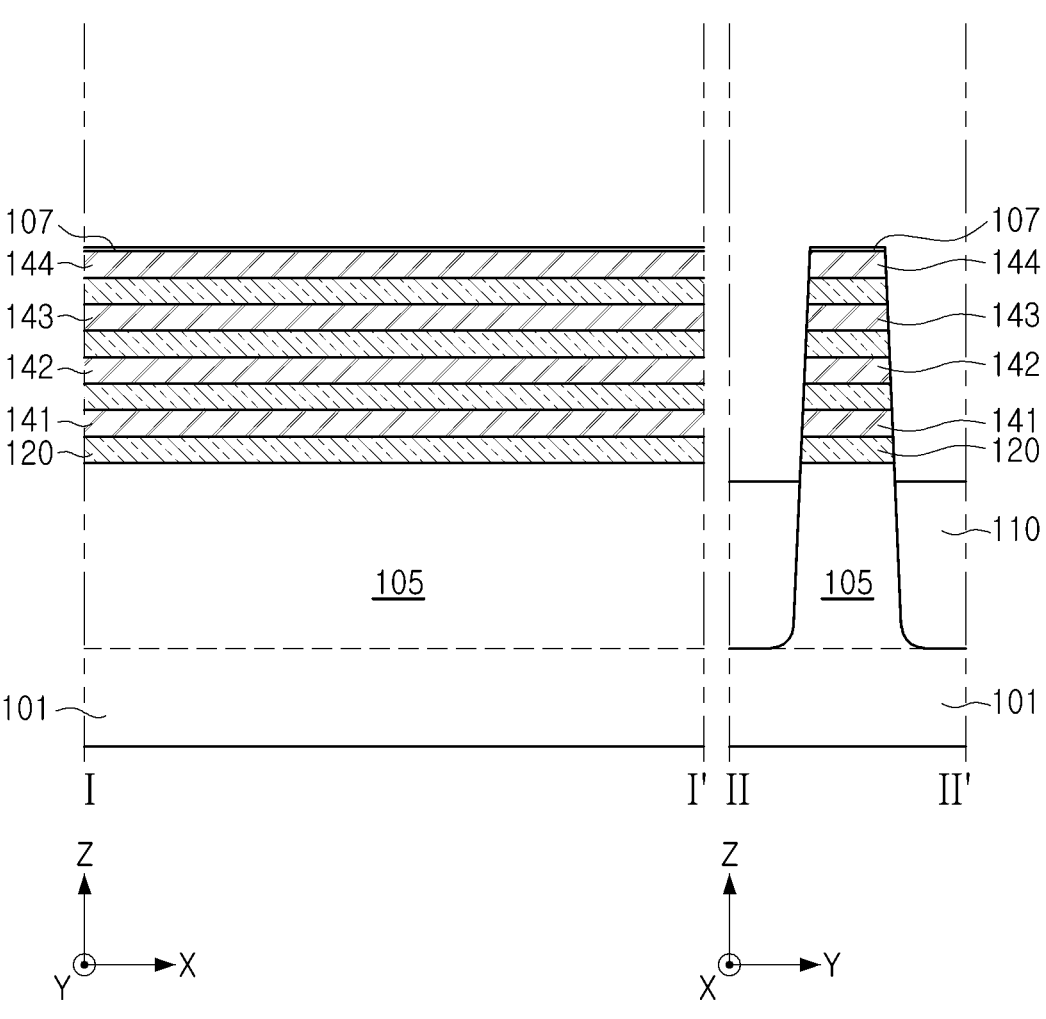

Referring to FIG. 10B, a cover insulating layer 107 is formed, an active structure including the active region 105 may be formed by partially removing the sacrificial layers 120, the first to fourth channel layers 141, 142, 143, and 144, and the substrate 101, and the device isolation layer 110 may be formed.

The cover insulating layer 107 may be formed to cover the upper surface of the fourth channel layer 144. In some embodiments, the cover insulating layer 107 may include a plurality of stacked insulating layers. The thickness of the cover insulating layer 107 may be vary in various example embodiments.

The active structure may include an active region 105, sacrificial layers 120, and first to fourth channel layers 141, 142, 143, and 144. The active structure may be formed in a line shape extending in one direction, for example, the X-direction, and may be formed to be spaced apart from the active structure adjacent thereto in the Y-direction. Side surfaces of the active structure in the Y-direction may be coplanar with each other and may be positioned on a straight line.

After filling the region in which portions of the active region 105, the sacrificial layers 120, and the first to fourth channel layers 141, 142, 143 and 144 have been removed, with an insulating material, the insulating material may be partially removed such that the active region 105 protrudes, thereby forming the device isolation layer 110. An upper surface of the device isolation layer 110 may be formed lower than an upper surface of the active region 105.

Figure 10C:
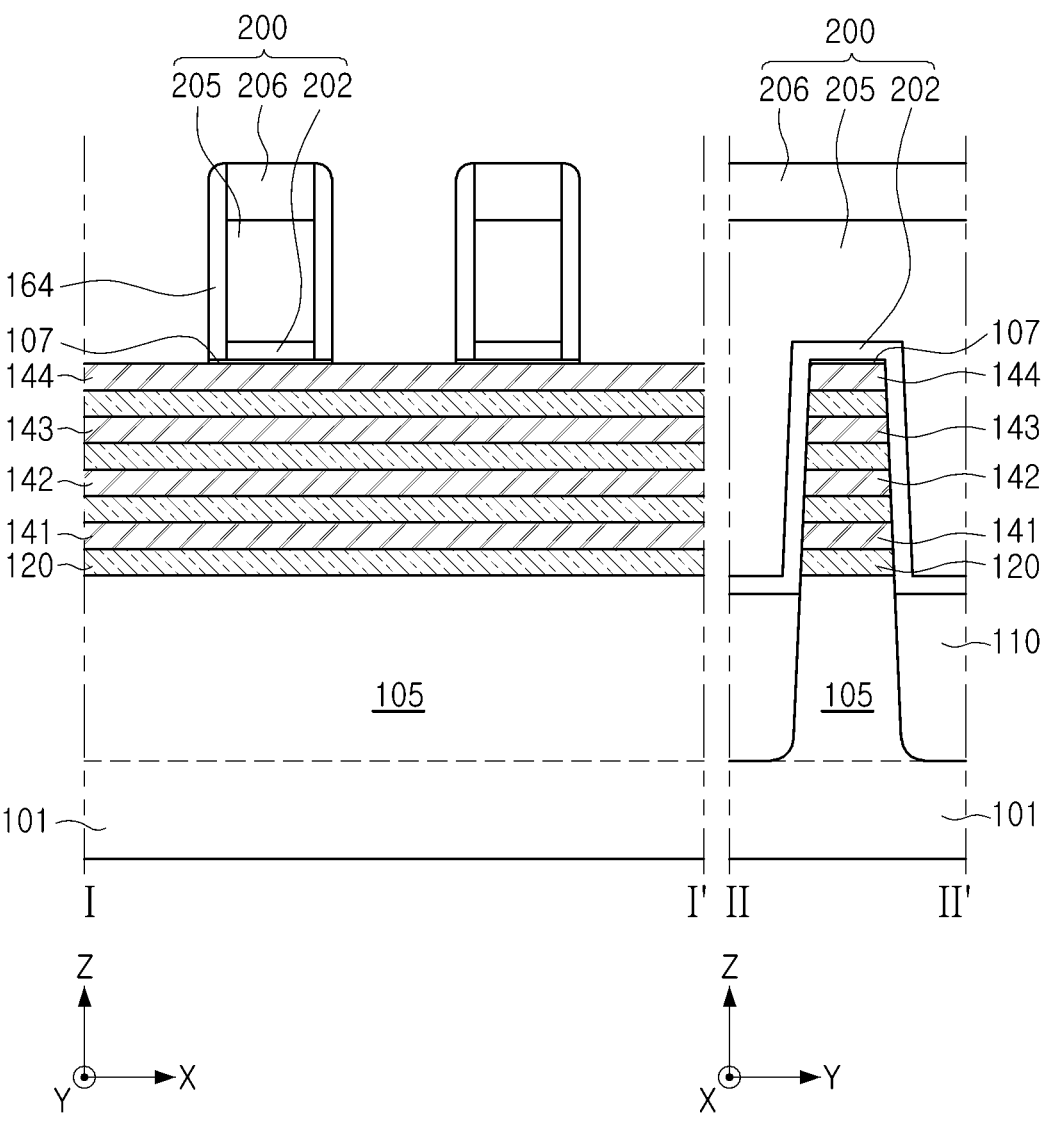

Referring to FIG. 10C, sacrificial gate structures 200 and gate spacer layers 164 may be formed on the active structure.

Each of the sacrificial gate structures 200 may be a sacrificial structure formed in a region where the gate dielectric layers 162 and the gate electrode layer 165 are disposed on the channel structure 140 through a subsequent process, as illustrated in FIG. 2. The sacrificial gate structures 200 may have a line shape extending in one direction while crossing the active structure. The sacrificial gate structures 200 may extend in the Y-direction, for example. Each of the sacrificial gate structures 200 may include first and second sacrificial gate layers 202 and 205 and a mask pattern layer 206 that are sequentially stacked. The first and second sacrificial gate layers 202 and 205 may be patterned using the mask pattern layer 206.

The first and second sacrificial gate layers 202 and 205 may be an insulating layer and a conductive layer, respectively, but are not limited thereto, and the first and second sacrificial gate layers 202 and 205 may be formed of one layer. For example, the first sacrificial gate layer 202 may include silicon oxide, and the second sacrificial gate layer 205 may include polysilicon. The mask pattern layer 206 may include silicon oxide and/or silicon nitride.

Gate spacer layers 164 may be formed on both sidewalls of the sacrificial gate structures 200. The gate spacer layers 164 may be formed of a low-k material, and may include, for example, at least one of SiO, SiN, SiCN, SiOC, SiON, or SiOCN. When forming the gate spacer layers 164, the cover insulating layer 107 may be removed outside the sacrificial gate structures 200 and the gate spacer layers 164. However, in some embodiments, the cover insulating layer 107 may be removed in a subsequent process step.

Figure 10D:
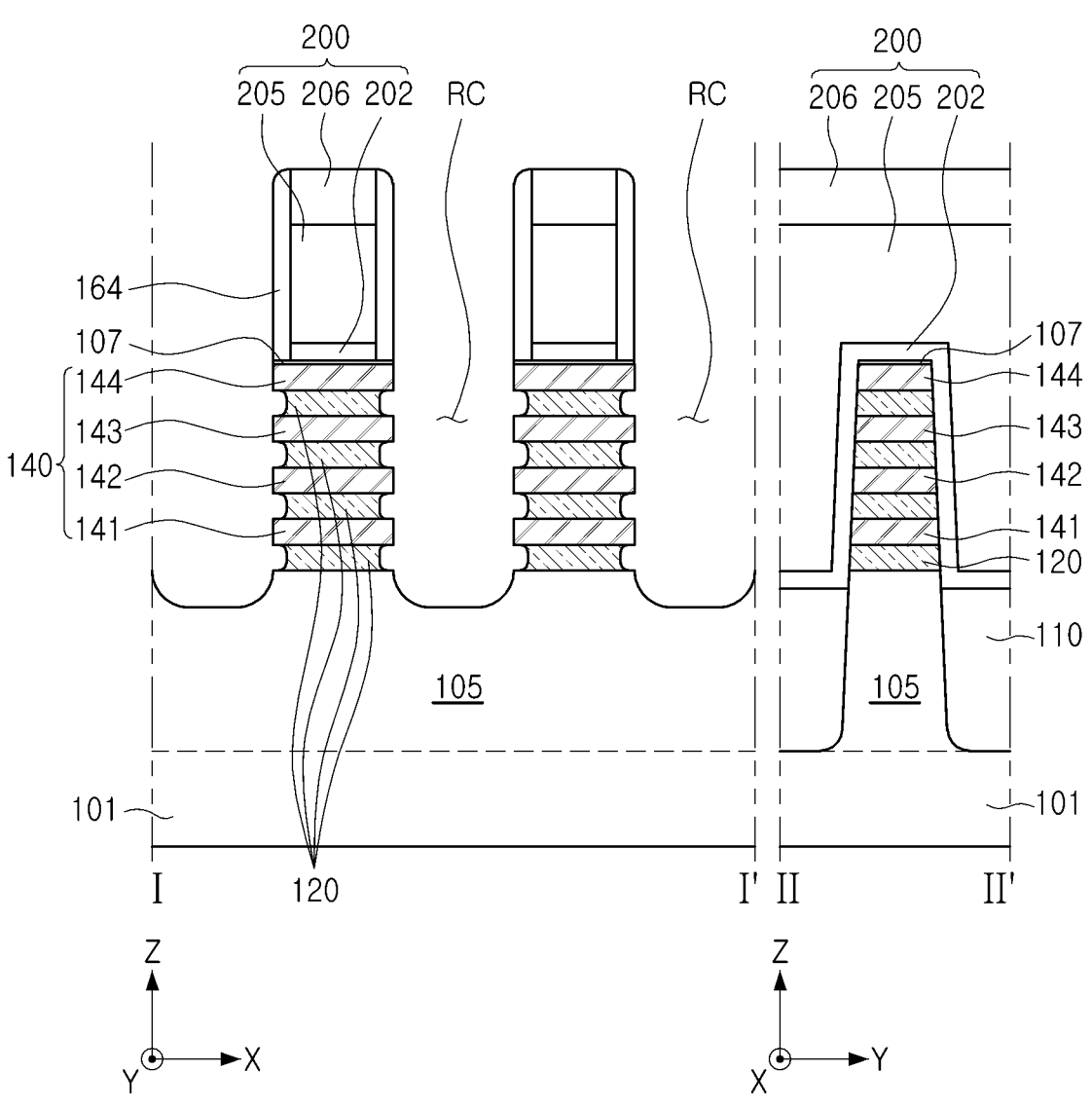

Referring to FIG. 10D, the sacrificial layers 120 and the first to fourth channel layers 141, 142, 143, and 144 exposed from the sacrificial gate structures 200 are partially removed to form recess regions RC, and the sacrificial layers 120 may be partially removed.

A portion of the exposed sacrificial layers 120 and portions of the first to fourth channel layers 141, 142, 143, and 144 are removed by using the sacrificial gate structures 200 and the gate spacer layers 164 as a mask, thereby forming the recess regions RC. Accordingly, the first to fourth channel layers 141, 142, 143, and 144 may form channel structures 140 having a limited length in the X-direction.

The sacrificial layers 120 may be selectively etched with respect to the channel structures 140 by, for example, a wet etching process, and may be removed to a predetermined depth from a side surface in the X-direction. The sacrificial layers 120 may have side surfaces that are concave inward due to side etching as described above. However, the detailed shape of the side surfaces of the sacrificial layers 120 is not limited to that illustrated in FIG. 10D.

Figure 10E:
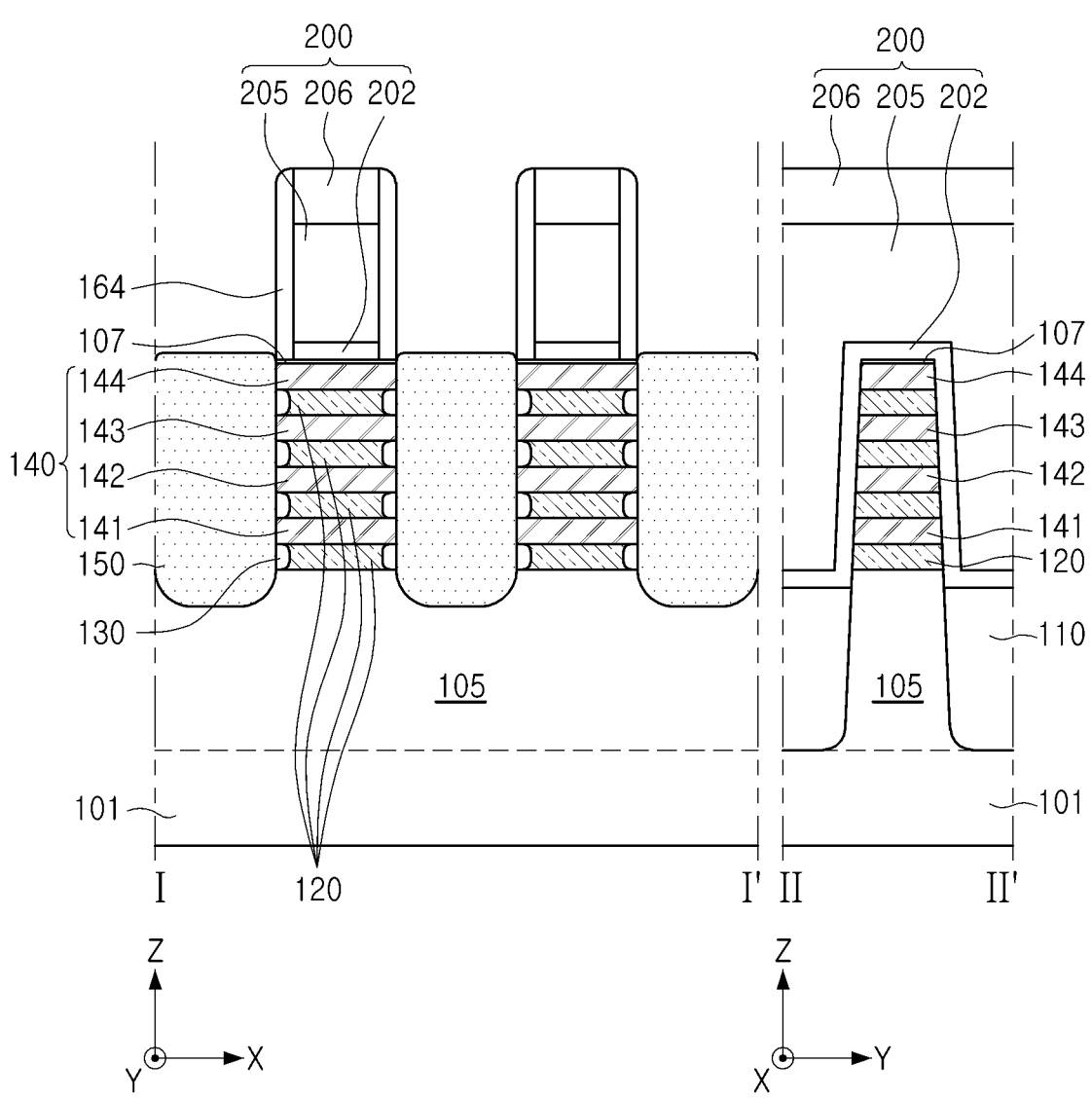

Referring to FIG. 10E, inner spacer layers 130 may be formed, and source/drain regions 150 may be formed in the recess regions RC.

The inner spacer layers 130 may be formed by filling regions where the sacrificial layers 120 have been partially removed with an insulating material and removing the insulating material deposited on the outside of the channel structures 140. The inner spacer layers 130 may be formed of the same material as the gate spacer layers 164, but are not limited thereto. For example, the inner spacer layers 130 may include at least one of SiN, SiCN, SiOCN, SiBCN, or SiBN.

The source/drain regions 150 may be formed by growing from side surfaces of the active region 105 and the channel structures 140 by, for example, a selective epitaxial process. The source/drain regions 150 may include impurities by in-situ doping or ex-situ doping. In some embodiments, the source/drain regions 150 may include a plurality of layers having different doping elements and/or doping concentrations.

Figure 10F:
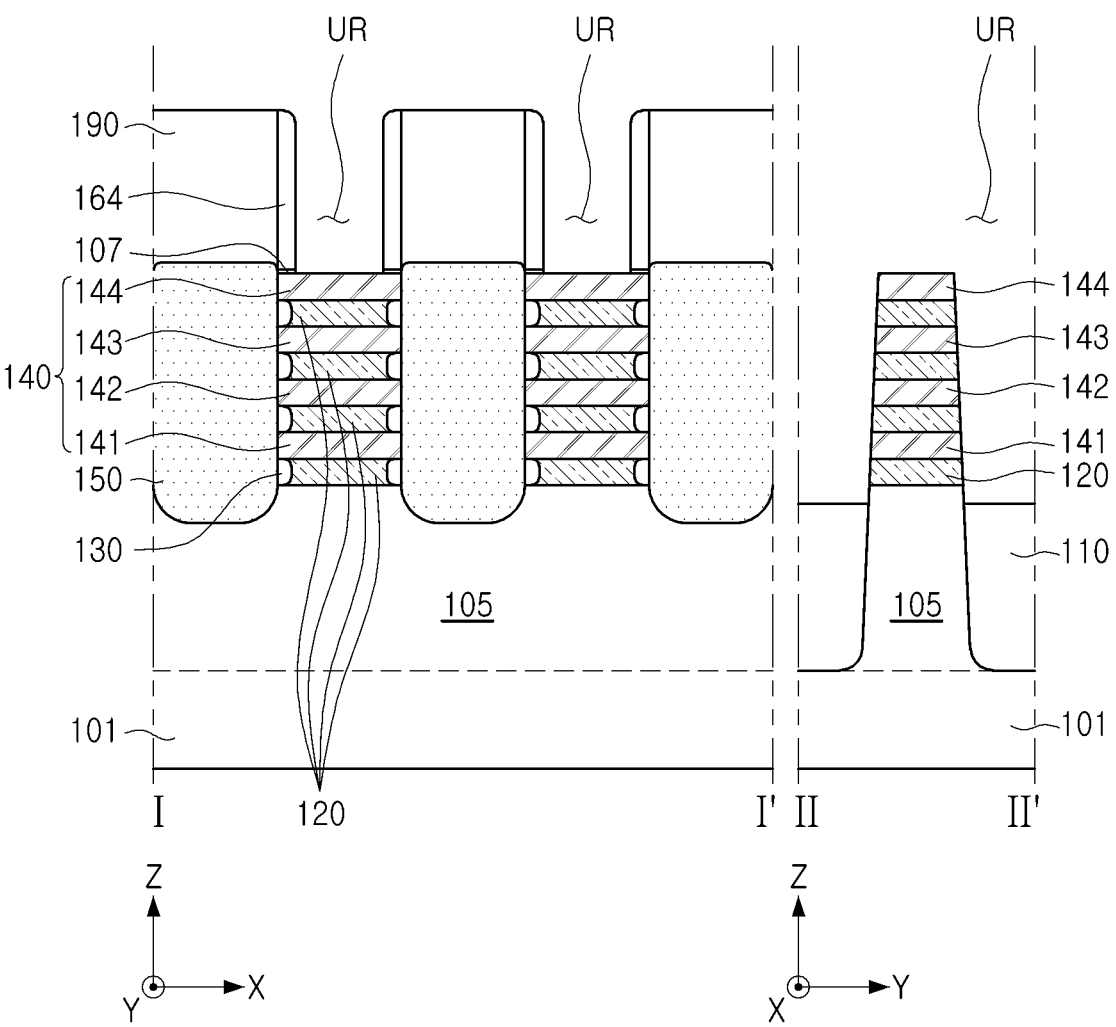

Referring to FIG. 10F, an interlayer insulating layer 190 may be formed and the sacrificial gate structures 200 may be removed.

The interlayer insulating layer 190 may be formed by forming an insulating film covering the sacrificial gate structures 200 and the source/drain regions 150 and performing a planarization process thereon to expose the mask pattern layers 206. During the planarization process, at least a portion of the mask pattern layers 206 may be removed.

The sacrificial gate structures 200 may be selectively removed with respect to the gate spacer layers 164, the interlayer insulating layer 190, and the channel structures 140. After the sacrificial gate structures 200 are removed, portions of the cover insulating layers 107 formed below the first sacrificial gate layer 202 may also be exposed and removed. Accordingly, upper gap regions UR may be formed, and upper surfaces of the fourth channel layers 144 may be exposed through the upper gap regions UR.

Figure 10G:
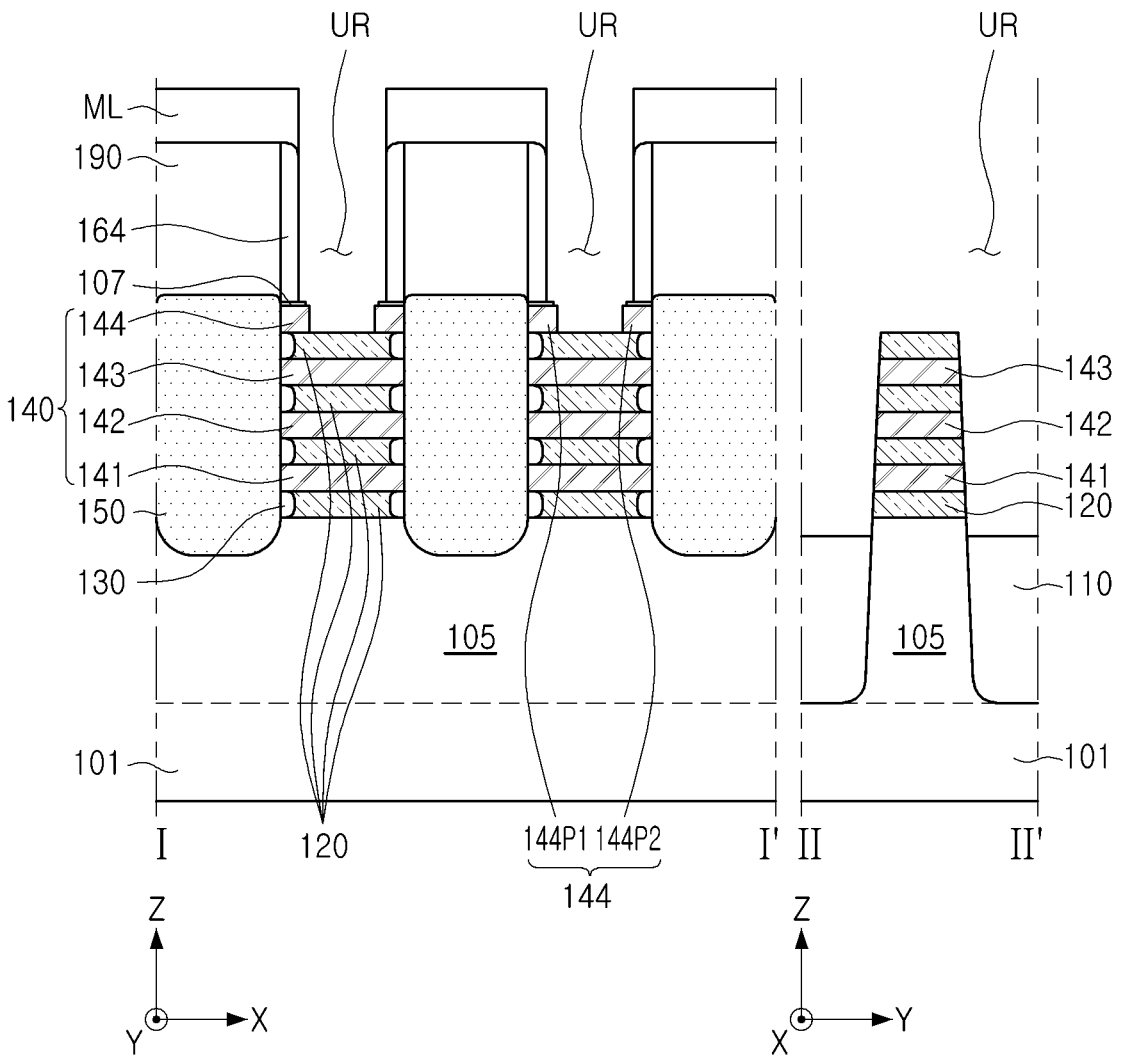

Referring to FIG. 10G, a mask layer ML may be formed and at least a portion of each of the fourth channel layers 144 may be removed.

The mask layer ML may be formed on the interlayer insulating layer 190 and the gate spacer layers 164 to expose the fourth channel layers 144. The mask layer ML may include at least one of a photoresist layer or a hard mask layer.

At least a portion of the fourth channel layers 144 may be removed by an etching process to form channel portions 144P1 and 144P2 spaced apart from each other. The etching process may be, for example, a dry etching process. The etching process is performed to have selectivity with respect to the sacrificial layers 120, such that at least a portion of only the fourth channel layers 144 on the uppermost sacrificial layer 120 may be selectively removed.

The semiconductor devices 100a, 100b, and 100c of the example embodiments of FIGS. 4A to 4C may be manufactured according to the alignment shape of the mask layer ML and the etching process conditions in this operation. In addition, in the case of the semiconductor device 100h of the example embodiment of FIG. 9, during the process of removing the fourth channel layers 144 in this operation, the device isolation layer 110 may be partially recessed in regions adjacent to ends of the active region 105.

Figure 10H:
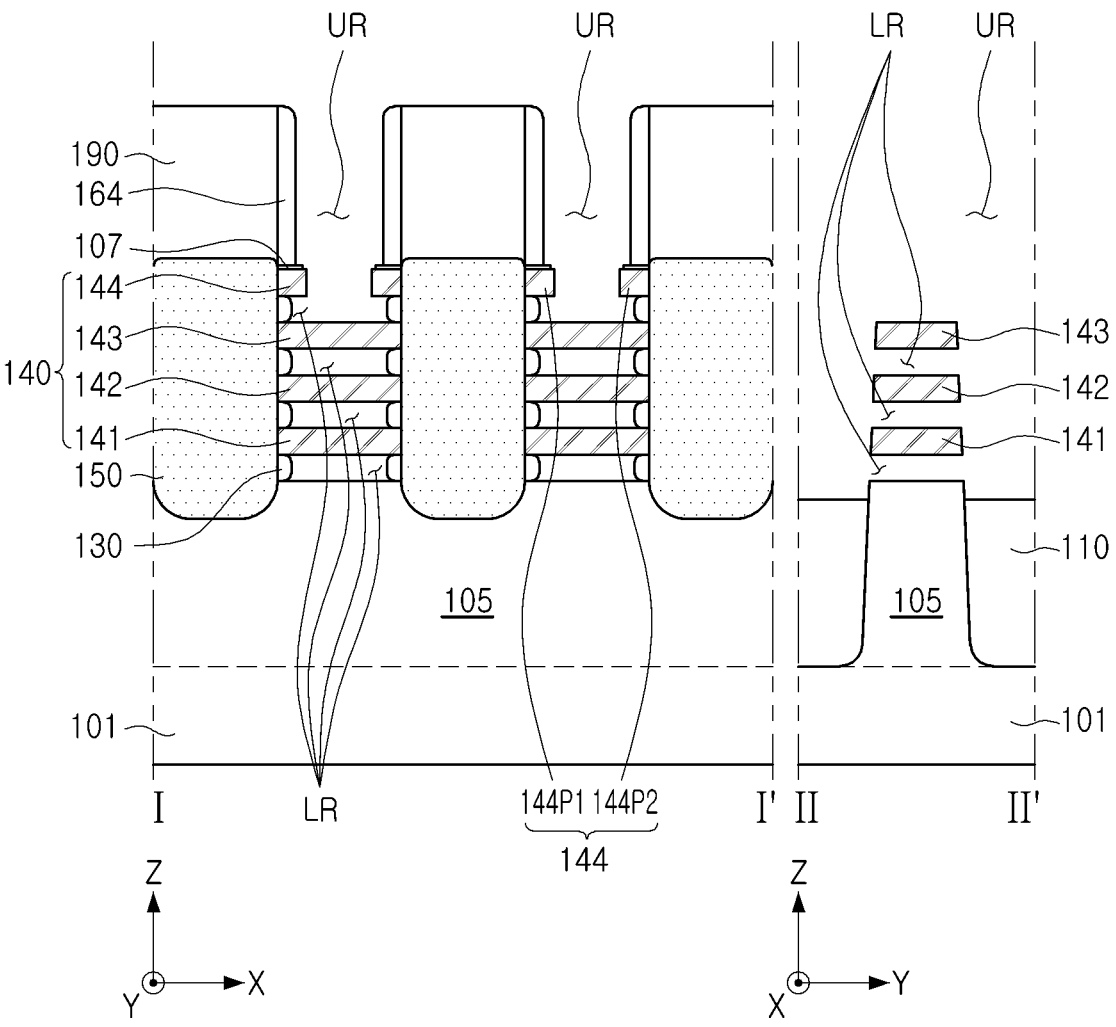

Referring to FIG. 10H, the mask layer ML may be removed and the sacrificial layers 120 may be removed.

The sacrificial layers 120 may be selectively removed with respect to the gate spacer layers 164, the interlayer insulating layer 190, and the channel structures 140. Accordingly, lower gap regions LR may be formed. For example, when the sacrificial layers 120 include silicon germanium (SiGe) and the channel structures 140 include silicon (Si), the sacrificial layers 120 may be selectively removed with respect to the channel structures 140 by performing wet etching. During the removal process, the source/drain regions 150 may be protected by an interlayer insulating layer 190 and inner spacer layers 130.

Figure 10I:
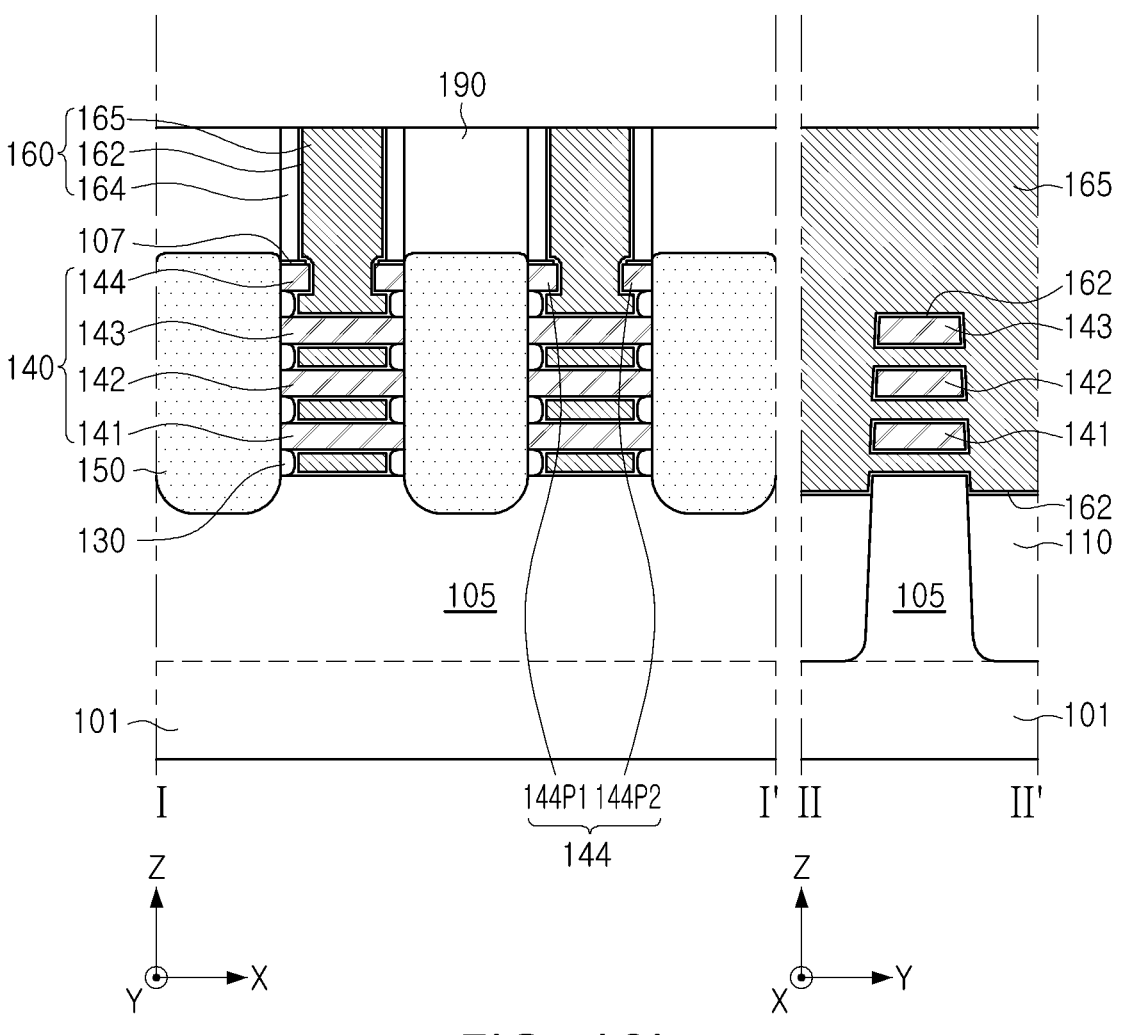

Referring to FIG. 10I, gate structures 160 may be formed.

The gate structures 160 may be formed to fill the upper gap regions UR and the lower gap regions LR. The gate dielectric layers 162 may be formed to conformally cover inner surfaces of the upper gap regions UR and the lower gap regions LR. The gate electrode layer 165 may be formed to completely fill the upper gap regions UR and lower gap regions LR, and then, may be removed to a predetermined depth from the upper portion in the upper gap regions UR, together with the gate dielectric layers 162 and the gate spacer layer 164. At this time, a portion of the interlayer insulating layer 190 may also be removed together, but example embodiments are not limited thereto. Accordingly, gate structures 160 each including the gate dielectric layers 162, the gate electrode layer 165, and the gate spacer layers 164 may be formed.

Next, referring to FIG. 2 together, contact plugs 180 may be formed.

First, an interlayer insulating layer 190 may be further formed on the gate structure 160. Contact holes exposing the source/drain regions 150 may be formed by patterning the interlayer insulating layer 190. Next, contact plugs 180 may be formed by filling the contact holes with a conductive material.

In detail, a material constituting the barrier layer is deposited in the contact holes, and then, on the lower end thereof, a metal-semiconductor compound layer such as a silicide layer may be formed by performing a silicide process. Next, contact plugs 180 may be formed by depositing a conductive material to fill the contact holes. As a result, the semiconductor device 100 of FIGS. 1 to 3 may be manufactured.

Figure 11A:
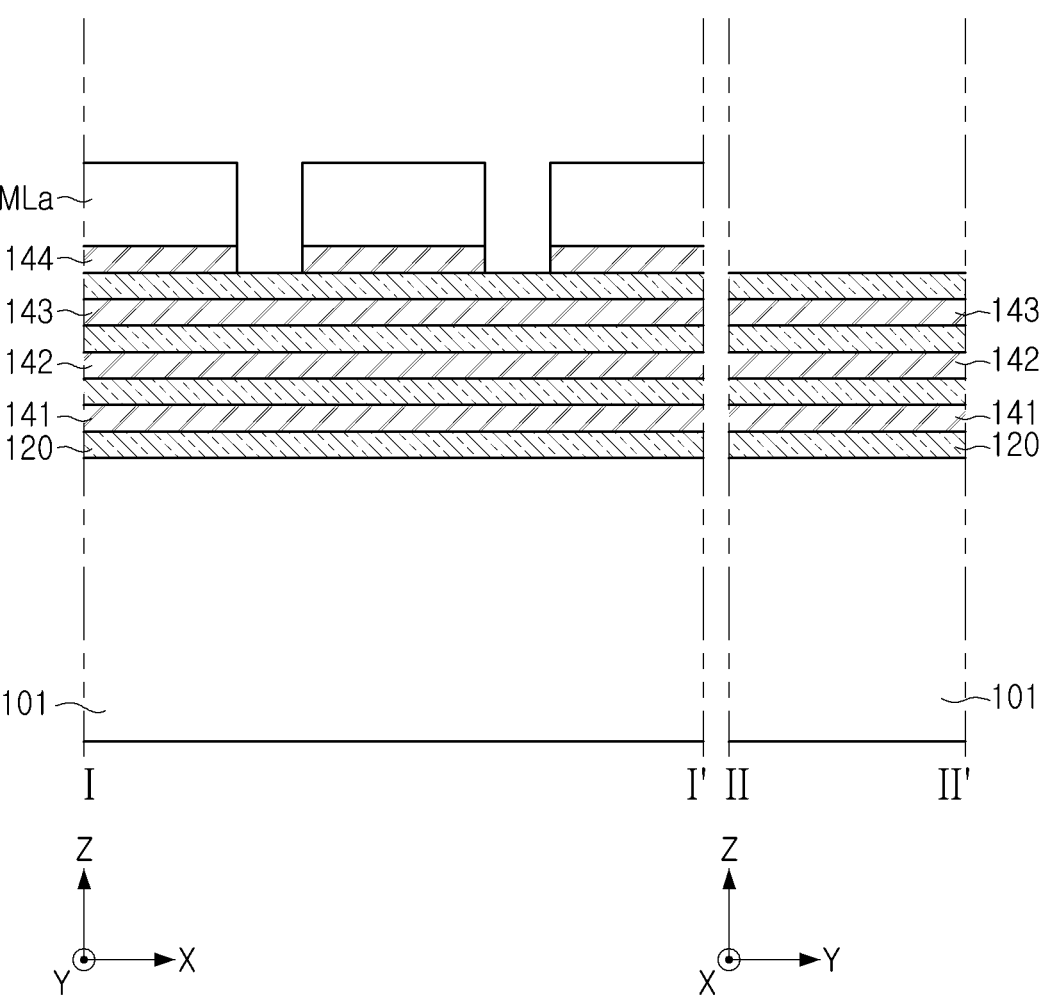
FIGS. 11A to 11C are views illustrating a process sequence to describe a method of manufacturing a semiconductor device according to example embodiments.
Figure 11B:
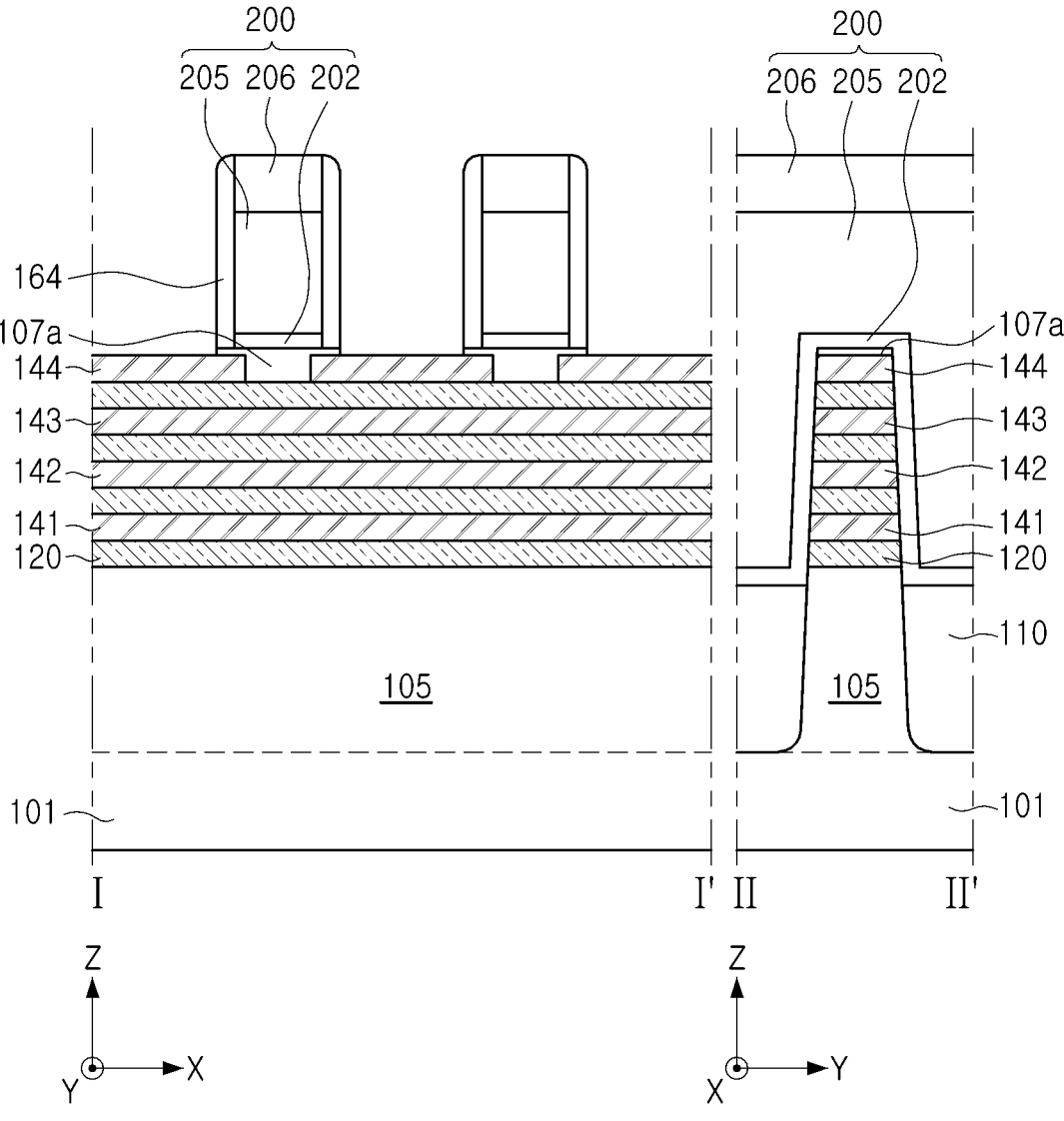
Figure 11C:
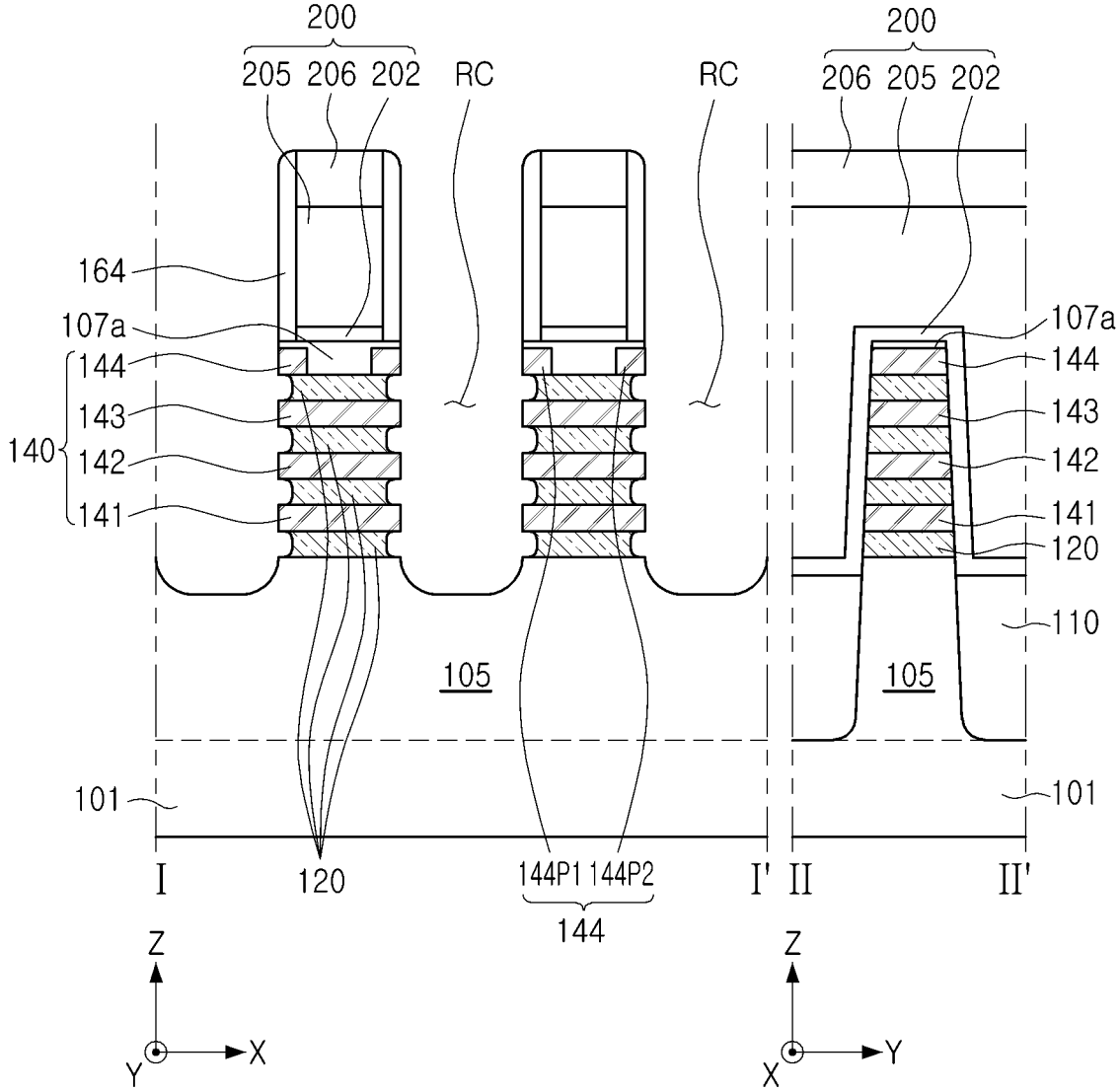

FIGS. 11A to 11C are views illustrating a process sequence to illustrate a method of manufacturing a semiconductor device according to example embodiments. FIGS. 11A to 11C illustrate an example embodiment of a method of manufacturing the semiconductor device of FIG. 2.

Referring to FIG. 11A, sacrificial layers 120 and first to fourth channel layers 141, 142, 143, and 144 are alternately stacked on a substrate 101, and after a mask layer MLa is formed, a portion of the fourth channel layer 144 may be removed.

The sacrificial layers 120 and the first to fourth channel layers 141, 142, 143, and 144 may be formed by the same process as described above with reference to FIG. 10A. The mask layer MLa may be patterned and formed to expose regions where the fourth channel layers 144 are to be removed, for example, regions corresponding to the gate electrode layers 165 (see FIG. 2). The fourth channel layer 144 may be partially removed from exposed regions to form a plurality of layers. The removal process may include, for example, a dry etching process.

Referring to FIG. 11B, after forming the cover insulating layer 107a, the active structure including the active region 105 and the device isolation layer 110 are formed, and then, sacrificial gate structures 200 and gate spacer layers 164 may be formed.

The cover insulating layer 107a may be formed to cover regions between the fourth channel layers 144 and upper surfaces. In some embodiments, the cover insulating layer 107 may include a plurality of stacked insulating layers.

The active structure and the device isolation layer 110 may be formed by the same process as described above with reference to FIG. 10B. The sacrificial gate structures 200 and the gate spacer layers 164 may be formed by the same process as described above with reference to FIG. 10C. The sacrificial gate structures 200 may be formed on regions where the fourth channel layers 144 have been removed.

Referring to FIG. 11C, the recess regions RC may be formed and the sacrificial layers 120 may be partially removed. These processes may be the same process as described above with reference to FIG. 10D.

Next, as described above with reference to FIG. 10E, inner spacer layers 130 are formed and source/drain regions 150 are formed in the recess regions RC, and as described above with reference to FIG. 10F, the interlayer insulating layer 190 may be formed and the sacrificial gate structures 200 may be removed. Next, as described above with reference to FIG. 10H, the sacrificial layers 120 are removed, and then, gate structures 160 are formed as described above with reference to FIG. 10I, and then, contact plugs 180 may be formed. As a result, the semiconductor device 100 of FIGS. 1 to 3 may be manufactured.

As set forth above, according to example embodiments, as parasitic capacitance may be reduced by removing a portion of the uppermost channel layer to include channel portions, a semiconductor device having improved electrical characteristics may be provided.

While aspects of example embodiments have been particularly shown and described, it will be understood that various changes in form and details may be made therein without departing from the spirit and scope of the following claims.

What is claimed is:

1. A semiconductor device comprising:
   a substrate comprising an active region extending in a first direction;
   a gate electrode layer crossing the active region and extending in a second direction;
   a plurality of channel layers on the active region, spaced apart from each other in a third direction, perpendicular to an upper surface of the substrate, disposed sequentially from the active region, and surrounded by the gate electrode layer;
   gate spacer layers on side surfaces of the gate electrode layer in the first direction; and source/drain regions on the active region, on sides of the gate electrode layer, and connected to the plurality of channel layers, wherein an uppermost channel layer among the plurality of channel layers comprises channel portions separated from each other in the first direction and disposed below the gate spacer layers, and wherein the channel portions protrude toward the gate electrode layer.

2. The semiconductor device of claim 1, further comprising a gate dielectric layer between the plurality of channel layers and the gate electrode layer, wherein the gate dielectric layer is disposed on inner side surfaces of the channel portions facing the gate electrode layer.

3. The semiconductor device of claim 1, further comprising inner spacer layers between the gate electrode layer and the source/drain regions, below the uppermost channel layer, wherein at least a portion of lower surfaces of the channel portions contact the inner spacer layers.

4. The semiconductor device of claim 1, wherein the plurality of channel portions are located at substantially a same level as each other.

5. The semiconductor device of claim 1, wherein the gate electrode layer has a first length between the channel portions in the first direction, and a second length on an upper surface of a channel layer below the uppermost channel layer among the plurality of channel layers, and wherein the second length is greater than the first length.

6. The semiconductor device of claim 1, wherein the gate electrode layer extends from above the uppermost channel layer to below the uppermost channel layer.

7. The semiconductor device of claim 1, wherein a level of a lower surface of an uppermost region of the gate electrode layer is lower than a level of upper surfaces of the source/drain regions.

8. The semiconductor device of claim 1, further comprising a cover insulating layer between lower surfaces of the gate spacer layers and the channel portions.

9. The semiconductor device of claim 1, wherein each of the channel portions comprises an upper region and a lower region below the upper region, and the upper region and the lower region have different lengths.

10. A semiconductor device comprising:

a substrate comprising a first active region extending in a first direction in a first region and a second active region extending in the first direction in a second region;

a first gate structure, crossing the first active region, on the first region, and extending in a second direction;

a second gate structure crossing the second active region, on the second region, and extending in the second direction;

a first channel layer, a second channel layer and a third channel layer on the first active region, spaced apart from each other in a third direction, perpendicular to an upper surface of the substrate, disposed sequentially from the first active region, and surrounded by the first gate structure;

a fourth channel layer, a fifth channel layer and a sixth channel layer on the second active region, spaced apart from each other in the third direction and disposed sequentially from the second active region, and surrounded by the second gate structure;

first source/drain regions on sides of the first gate structure, on the first active region and connected to the first, the second, and the third channel layers; and second source/drain regions on sides of the second gate structure, on the second active region and connected to the fourth, the fifth, and the sixth channel layers, wherein a germanium (Ge) concentration of the first source/drain regions is higher than a germanium (Ge) concentration of the second source/drain regions, and wherein the third channel layer comprises channel portions spaced apart from each other in the first direction below the first gate structure.

11. The semiconductor device of claim 10, wherein the sixth channel layer is disposed below the second gate structure as a single layer extending in the first direction.

12. The semiconductor device of claim 10, further comprising:

first contact plugs connected to the first source/drain regions; and second contact plugs connected to the second source/drain regions, wherein the first contact plugs recess the first source/drain regions from upper surfaces of the first source/drain regions to a first depth, and the second contact plugs recess the second source/drain regions from upper surfaces of the second source/drain regions to a second depth different from the first depth.

13. The semiconductor device of claim 12, wherein the first depth is greater than the second depth.

14. A semiconductor device comprising:

a substrate comprising an active region extending in a first direction;

a gate structure on the substrate, crossing the active region and extending in a second direction; and a first channel layer, a second channel layer and a third channel layer on the active region, spaced apart from each other in a third direction, perpendicular to an upper surface of the substrate, and disposed sequentially from the active region and surrounded by the gate structure, wherein the third channel layer comprises channel portions respectively disposed below end portions of the gate structure in the first direction, wherein the gate structure has a first length between the channel portions in the first direction and a second length on an upper surface of the second channel layer, and wherein the second length is different than the first length.

15. The semiconductor device of claim 14, wherein the channel portions are located outside of a vertical central axis of the gate structure in the first direction.

16. The semiconductor device of claim 14, wherein each of the channel portions has a length in the first direction that is less than half of a length of the first channel layer in the first direction and less than half of a length of the second channel layer in the first direction.

17. The semiconductor device of claim 14, wherein the gate structure is provided on opposite side surfaces of the channel portions and extends between the side surfaces.

* * * * *